(12) United States Patent
Bushnaq et al.

(10) Patent No.: US 10,325,667 B2
(45) Date of Patent: Jun. 18, 2019

(54) SEMICONDUCTOR STORAGE DEVICE

(71) Applicant: TOSHIBA MEMORY CORPORATION, Tokyo (JP)

(72) Inventors: Sanad Bushnaq, Yokohama Kanagawa (JP); Toshifumi Hashimoto, Fujisawa Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 15/909,630

(22) Filed: Mar. 1, 2018

(65) Prior Publication Data
US 2019/0080776 A1    Mar. 14, 2019

(30) Foreign Application Priority Data

Sep. 14, 2017 (JP) .................................. 2017-176686

(51) Int. Cl.
| G11C 16/34 | (2006.01) |
| G11C 16/08 | (2006.01) |
| G11C 16/10 | (2006.01) |
| G11C 8/12 | (2006.01) |
| G11C 16/04 | (2006.01) |
| G11C 16/26 | (2006.01) |

(52) U.S. Cl.
CPC ............ *G11C 16/3459* (2013.01); *G11C 8/12* (2013.01); *G11C 16/0483* (2013.01); *G11C 16/08* (2013.01); *G11C 16/10* (2013.01); *G11C 16/26* (2013.01); *G11C 16/3445* (2013.01)

(58) Field of Classification Search
None
See application file for complete search history.

(56) References Cited

U.S. PATENT DOCUMENTS

| 7,936,004 B2 | 5/2011 | Kito et al. | |
| 2011/0149661 A1* | 6/2011 | Rajwani | G11C 7/12 365/189.11 |

FOREIGN PATENT DOCUMENTS

| TW | 200822123 A | 5/2008 |
| TW | I475570 B | 3/2015 |

* cited by examiner

*Primary Examiner* — James G Norman
(74) *Attorney, Agent, or Firm* — Kim & Stewart LLP

(57) ABSTRACT

A semiconductor storage device includes a word line and a wiring, a first transistor controlled to connect the word line to the wiring, a first booster circuit configured to boost an output voltage thereof to a first voltage, a second transistor controlled to connect the first booster circuit to the wiring, and a control circuit configured to control the first booster circuit, and the first and second transistors during a read operation. During the read operation, the control circuit controls the first booster circuit to start boosting its output voltage to the first voltage while controlling the second transistor to connect the output of the first booster circuit to the wiring so that a voltage of the wiring rises together with the output voltage. After the output voltage has reached the first voltage, the control circuit controls the first transistor to connect the word line to the wiring.

20 Claims, 19 Drawing Sheets

SEMICONDUCTOR STORAGE DEVICE

CROSS-REFERENCE TO RELATED APPLICATION

This application is based upon and claims the benefit of priority from Japanese Patent Application No. 2017-176686, filed Sep. 14, 2017, the entire contents of which are incorporated herein by reference.

FIELD

Embodiments described herein relate generally to a semiconductor storage device.

BACKGROUND

A NAND flash memory has been known as a semiconductor storage device.

DETAILED DESCRIPTION

Embodiments reduce time which is required for a semiconductor storage device to read data.

In general, according to one embodiment, a semiconductor storage device includes a word line and a wiring, a first transistor that is controlled to connect the word line to the wiring, a first booster circuit configured to boost an output voltage thereof to a first voltage, a second transistor that is controlled to connect an output of the first booster circuit to the wiring, and a control circuit configured to control the first booster circuit, and the first and second transistors during a read operation. During the read operation, the control circuit controls the first booster circuit to start boosting the output voltage thereof to the first voltage while controlling the second transistor to connect the output of the first booster circuit to the wiring so that a voltage of the wiring rises together with the output voltage of the first booster circuit. After the output voltage of the first booster circuit has reached the first voltage, the control circuit controls the first transistor to connect the word line to the wiring.

Hereinafter, embodiments will be described with reference to the accompanying drawings. Further, in the description below, a common reference symbol is given to components which have the same function and configuration. In addition, in a case where a plurality of components is given the same reference symbol, the components are distinguished by attaching a subscript to the common reference symbol. Further, in a case where it is not necessary to distinguish the components, only the common reference symbol is used and the subscript is not used.

1. First Embodiment

A semiconductor storage device according to a first embodiment will be described.

1.1 Configuration

First, a configuration of the semiconductor storage device according to the first embodiment will be described.

1.1.1 Overall Configuration of Memory System

Figure 1:
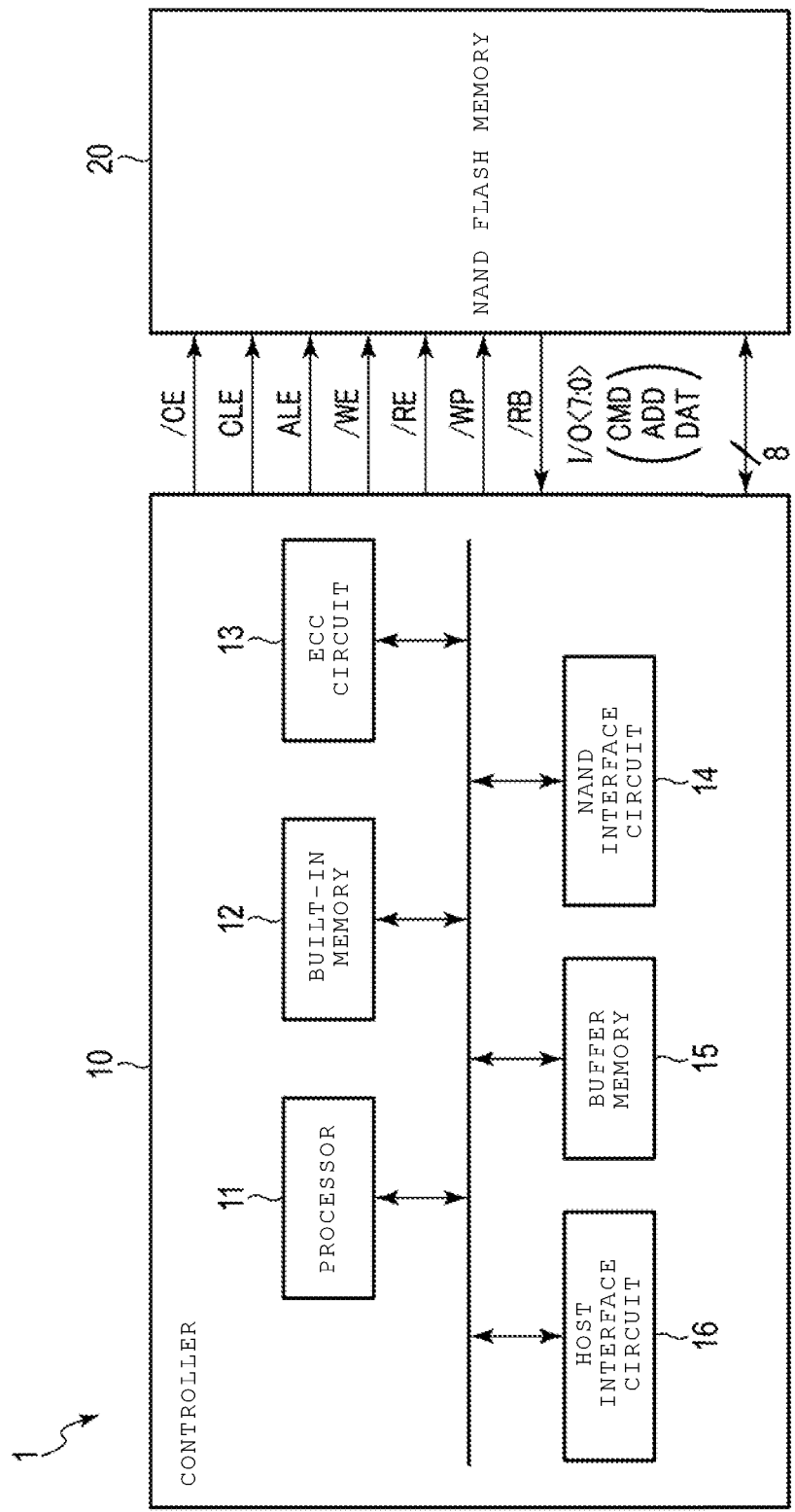
FIG. 1 is a block diagram illustrating a configuration of a memory system according to a first embodiment.

An example of a configuration of a memory system according to the first embodiment will be described with reference to FIG. 1. FIG. 1 is a block diagram illustrating the example of the configuration of the memory system according to the first embodiment. A memory system 1 communicates with, for example, an external host device which is not illustrated in the drawing. The memory system 1 stores data from the host device (not illustrated in the drawing), and, in addition, reads the data from the host device.

As illustrated in FIG. 1, the memory system 1 includes a controller 10 and a semiconductor storage device (NAND flash memory) 20. The controller 10 receives a command from the host device, and controls the semiconductor storage device 20 based on the received command. Specifically, the controller 10 writes data, which is instructed to be written from the host device, in the semiconductor storage device 20, reads data, which is instructed to be read from the host device, from the semiconductor storage device 20, and transmits the data to the host device. The controller 10 is connected to the semiconductor storage device 20 via a NAND bus. The semiconductor storage device 20 includes a plurality of memory cells, and non-volatilely stores data.

The NAND bus transmits and receives respective signals /CE, CLE, ALE, /WE, /RE, /WP, /RB, and I/O<7:0> according to a NAND interface via individual signal lines. The signal /CE is a signal used to enable the semiconductor storage device 20. The signal CLE notifies the semiconductor storage device 20 that the signal I/O<7:0>, which flows to the semiconductor storage device 20, is an address while the signal CLE is at an "H (High)" level. The signal ALE notifies the semiconductor storage device 20 that the signal I/O<7:0>, which flows to the semiconductor storage device 20 while the signal ALE is at an "H (High)" level, is an address. The signal /WE is used to instruct to fetch the signal I/O<7:0>, which flows to the semiconductor storage device 20, to the semiconductor storage device 20 while the signal /WE is at an "L (Low)" level. The signal /RE is used to instruct the semiconductor storage device 20 to output the signal I/O<7:0>. The signal /WP instructs to prohibit the semiconductor storage device 20 from writing and erasing data. The signal /RB indicates whether the semiconductor storage device 20 is in a ready state (i.e., a state in which a command from the outside can be received) or in a busy state (i.e., state in which the command from the outside cannot be received). The signal I/O<7:0> is, for example, an 8-bit signal. The signal I/O<7:0> is a substance of data which is transmitted and received between the semiconductor storage device 20 and the controller 10, and includes a command CMD, an address ADD, and data DAT. The data DAT includes write data and read data.

1.1.2 Configuration of Controller

Subsequently, the controller of the memory system according to the first embodiment will be described with reference to FIG. 1. The controller 10 includes a processor (Central Processing Unit (CPU)) 11, a built-in memory (Random Access Memory (RAM)) 12, an Error Check and Correction (ECC) circuit 13, a NAND interface circuit 14, a buffer memory 15, and a host interface circuit 16.

The processor 11 controls the entire operation of the controller 10. The processor 11 issues a read command based on the NAND interface with respect to the semiconductor storage device 20 in response to, for example, a read command of data received from the host device. The operation is the same as in a case of write and erase. In addition, the processor 11 has a function of performing various calculations with respect to read data from the semiconductor storage device 20.

The built-in memory 12 is, for example, a semiconductor storage device such as a Dynamic RAM (DRAM), and is used as a work area of the processor 11. The built-in memory 12 stores firmware used to manage the semiconductor storage device 20, various management tables, and the like.

The ECC circuit 13 performs processes of error detection and error correction. More specifically, in a case where data is written, the ECC circuit 13 generates an ECC symbol for each set having a certain number of data based on the data received from the host device. In addition, in a case where the data is read, ECC is decoded based on the ECC symbol, and existence/non-existence of an error is detected. Furthermore, in a case where the error is detected, a bit location thereof is specified, and the error is corrected.

The NAND interface circuit 14 is connected to the semiconductor storage device 20 via the NAND bus, and performs communication with the semiconductor storage device 20. The NAND interface circuit 14 transmits the command CMD, the address ADD, and the write data to the semiconductor storage device 20 according to an instruction of the processor 11. In addition, the NAND interface circuit 14 receives the read data from the semiconductor storage device 20.

The buffer memory 15 temporarily stores the data or the like which is received by the controller 10 from the semiconductor storage device 20 and the host device. The buffer memory 15 is used as a storage area that temporarily stores, for example, the read data from the semiconductor storage device 20, results of the calculations with respect to the read data, and the like.

The host interface circuit 16 is connected to the host device, and performs communication with the host device. The host interface circuit 16 transmits, for example, the command and the data, which are received from the host device, to the processor 11 and the buffer memory 15, respectively.

1.1.3 Configuration of Semiconductor Storage Device

Figure 2:
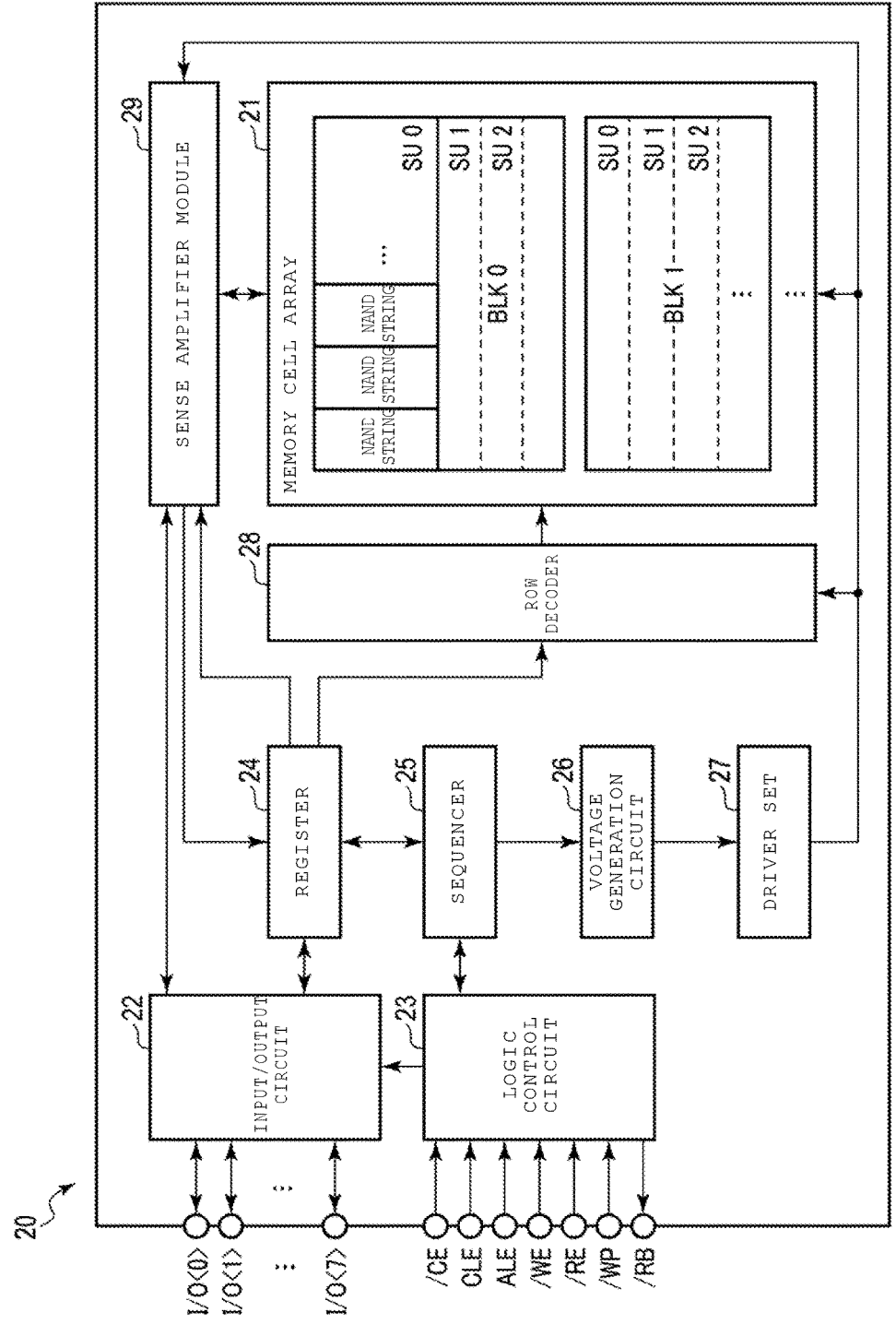
FIG. 2 is a block diagram illustrating a configuration of a semiconductor storage device according to the first embodiment.

Subsequently, an example of a configuration of the semiconductor storage device according to the first embodiment will be described with reference to FIG. 2. FIG. 2 is a block diagram illustrating the example of the configuration of the semiconductor storage device according to the first embodiment.

The semiconductor storage device 20 includes a memory cell array 21, an input/output circuit 22, a logic control circuit 23, a register 24, a sequencer 25, a voltage generation circuit 26, a driver set 27, a row decoder 28, and a sense amplifier module 29.

The memory cell array 21 includes a plurality of blocks BLK (BLK0, BLK1, . . . ). The block BLK includes a plurality of nonvolatile memory cell transistors (not illustrated in the drawing) associated with word lines and bit lines. The block BLK becomes, for example, a data erase unit, and data in the same block BLK is erased collectively. Each block BLK includes a plurality of string units SU (SU0, SU1, SU2, . . . ). Each string unit SU is a set of NAND strings NS. The NAND string NS includes the plurality of memory cell transistors. Further, it is possible to set the number of blocks in the memory cell array 21, the number of string units in one block BLK, and the number of NAND strings in one string unit SU is not limited to any specific number.

The input/output circuit 22 transmits and receives the signal I/O<7:0> to and from the controller 10. The input/output circuit 22 transmits the command CMD and the address ADD in the signal I/O<7:0> to the register 24. The input/output circuit 22 transmits and receives the write data and the read data to and from the sense amplifier module 29.

The logic control circuit 23 receives the signals /CE, CLE, ALE, /WE, /RE, and /WP from the controller 10. In addition, the logic control circuit 23 transmits the signal /RB to the controller 10, thereby notifying to the outside of a state of the semiconductor storage device 20.

The register 24 stores the command CMD and the address ADD. The register 24 transmits the address ADD to the row decoder 28 and the sense amplifier module 29, and transmits the command CMD to the sequencer 25.

The sequencer 25 receives the command CMD, and controls the entire semiconductor storage device 20 according to a sequence based on the received command CMD.

The voltage generation circuit 26 generates voltages, which are necessary for operations of writing, reading, and erasing the data, based on an instruction from the sequencer 25. The voltage generation circuit 26 supplies the generated voltages to the driver set 27.

The driver set 27 includes a plurality of drivers, and supplies various voltages from the voltage generation circuit 26 to the row decoder 28 and the sense amplifier module 29 based on an address from the register 24. The driver set 27 supplies various voltages to the row decoder 28 based on, for example, a row address of the addresses.

The row decoder 28 receives the row address of the address ADD from the register 24, and selects the block BLK or the like based on, for example, a block address in the row address. Furthermore, the voltage is transmitted from the driver set 27 to the selected block BLK via the row decoder 28.

The voltage generation circuit 26, the driver set 27, and the row decoder 28 will be described in detail later.

The sense amplifier module 29 senses the read data, which is read at a bit line from the memory cell transistor, in a case where the data is read, and transmits the sensed read data to the input/output circuit 22. The sense amplifier module 29 transmits the write data, which is written via the bit line, to the memory cell transistor in a case where the data is written. In addition, the sense amplifier module 29 receives a column address of the address ADD from the register 24, and outputs data of the column based on the column address.

1.1.4 Configuration of Memory Cell Array

Subsequently, a configuration of the memory cell array of the semiconductor storage device according to the first embodiment will be described with reference to FIG. 3. FIG. is an example of a circuit diagram illustrating the configuration of the memory cell array of the semiconductor storage device according to the first embodiment.

Figure 3:
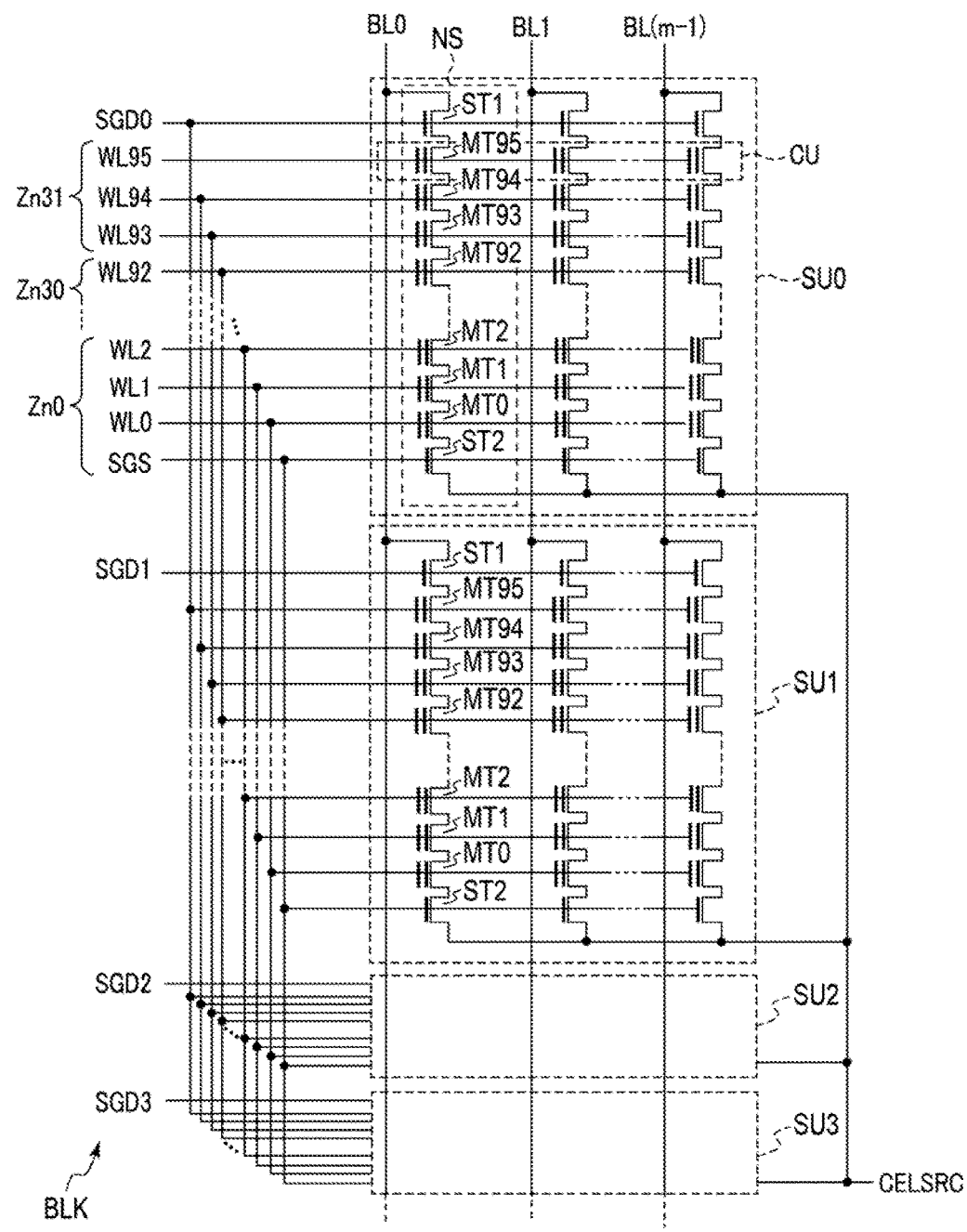
FIG. 3 is a circuit diagram illustrating a configuration of a memory cell array of the semiconductor storage device according to the first embodiment.

As illustrated in FIG. 3, each of the NAND strings NS includes, for example, 96 memory cell transistors MT (MT0 to MT95), a select transistor ST1, and a select transistor ST2. Further, the number of memory cell transistors MT is not limited to 96. The number of memory cell transistors MT may be 8, 16, 32, 64, 128, or the like, and the number is not limited. The memory cell transistor MT includes a control gate and a stacked layer gate which includes a charge storage layer. The respective memory cell transistors MT are connected in series between the select transistors ST1 and ST2. Further, in the description below, "connection" includes a case where another conductive element is interposed therebetween.

In a certain block BLK, gates of the select transistors ST1 of the string units SU0 to SU3 are respectively connected to select gate lines SGD0 to SGD3. In addition, gates of the select transistors ST2 of all the string units SU in the block BLK are commonly connected to a select gate line SGS. The control gates of the memory cell transistors MT0 to MT95 in the same block BLK are respectively connected to word lines WL0 to WL95. That is, the word lines WL of the same address are commonly connected to all the string units SU in the same block BLK, and the select gate line SGS is commonly connected to all the string units SU in the same block BLK. In contrast, the select gate line SGD is connected to only one string unit SU in the same block BLK.

In addition, another end of each of the select transistors ST1 of the NAND strings NS at the same row among the NAND strings NS which are disposed in a matrix configuration in the memory cell array 21 is connected to any one of m bit lines BL (BL0 to BL (m−1) (m is a natural number)). In addition, the bit lines BL are commonly connected to the NAND strings NS at the same column over the plurality of blocks BLK.

In addition, another end of each of the select transistors ST2 is connected to a source line CELSRC. The source line CELSRC is commonly connected to the plurality of NAND strings NS over the plurality of blocks BLK.

Further, in the first embodiment, as an example, a set of three adjacent word lines WL is defined as one "zone Zn". Therefore, 32 zones Zn0 to Zn31 are provided to correspond to the 96 word lines WL0 to WL95. More specifically, the zone Zn0 includes the word lines WL0 to WL2. The zone Zn1 includes the word lines WL3 to WL5, and the zone Zn2 includes the word lines WL6 to WL8. In the same manner, the zone Zn31 includes the word lines WL93 to 95.

As described above, data is erased, for example, with respect to the memory cell transistors MT in the same block BLK as a unit. In contrast, data may be read and written for the plurality of memory cell transistors MT, which are commonly connected to any one of the word lines WL in any one of the string units SU of any one of the blocks BLK, as a unit. A set of the memory cell transistors MT, which share the word line WL in one string unit SU, is referred to as, for example, a cell unit CU. That is, the cell unit CU is a set of the memory cell transistors MT on which the write or read operation is performed as a unit.

Further, it is possible for one memory cell transistor MT to store, for example, a plurality of bit data. Furthermore, in the same cell unit CU, a set of one bits, consisting of one bit from each of the memory cell transistors MT in the same cell unit CU, is referred to as a "page". That is, it is possible to define the "page" as a part of a memory space formed in a set of memory cell transistors MT in the same cell unit CU.

Figure 4:
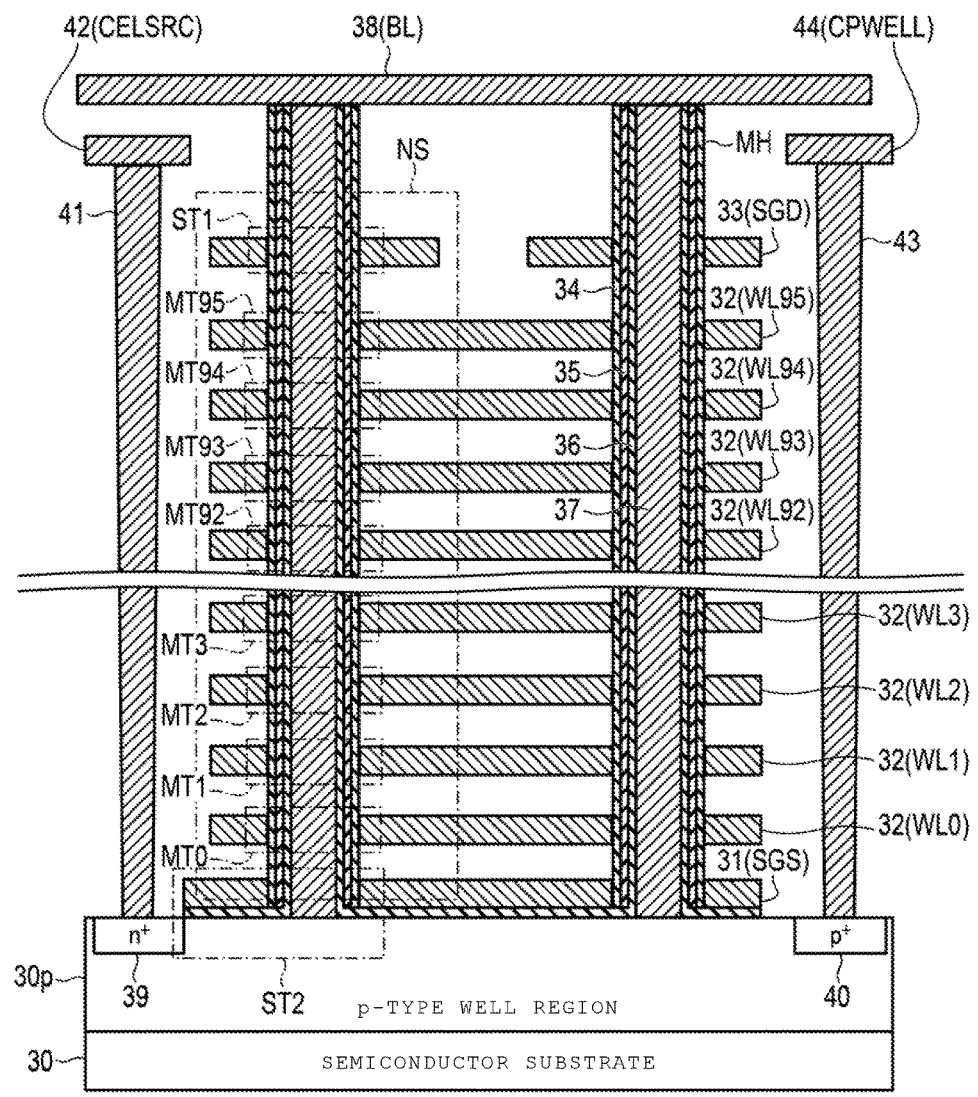
FIG. 4 is a sectional diagram illustrating a configuration of the memory cell array of the semiconductor storage device according to the first embodiment.

Subsequently, a sectional structure of the memory cell array 21 will be described with reference to FIG. 4. FIG. 4 illustrates an example of the sectional structure of some parts of the memory cell array of the semiconductor storage device according to the first embodiment. Specifically, FIG. 4 illustrates two parts, that is, string units SU0 and SU1 in one block BLK. Specifically, FIG. 4 illustrates two NAND strings NS and parts around the NAND strings of each of the two string units SU0 and SU1. Furthermore, the NAND strings NS each having the configuration illustrated in FIG. 4 are arranged in an X direction and a Y direction. For example, a set of the plurality of NAND strings NS, which are arranged in the X direction and the Y direction, corresponds to one string unit SU.

The semiconductor storage device 20 is provided on a semiconductor substrate 30. In the description below, a surface which is parallel to the surface of the semiconductor substrate 30 is an XY plane, and a direction which is perpendicular to the XY plane is a Z direction. In addition, the X direction and the Y direction are orthogonal to each other.

A p-type well region 30p is provided on an upper part of the semiconductor substrate 30. The plurality of NAND strings NS are provided on the p-type well region 30p. That is, on the p-type well region 30p, for example, a wiring layer 31 which functions as the select gate line SGS, a 96-layered wiring layer 32 (WL0 to WL95) which functions as the word lines WL0 to WL95, and a wiring layer 33 which functions as the select gate line SGD are sequentially stacked. The wiring layers 31 and 33 may each include plural layers. Insulating films which are not illustrated in the drawing are provided between the stacked wiring layers 31 to 33.

The wiring layer 31 is commonly connected to, for example, gates of the respective select transistors ST2 of the plurality of NAND strings NS in one block BLK. The wiring layer 32 is commonly connected to control gates of the respective memory cell transistors MT of the plurality of NAND strings NS in one block BLK. The wiring layer 33 is commonly connected to gates of the respective select transistors ST1 of the plurality of NAND strings NS in one string unit SU.

A memory hole MH is provided to penetrate the wiring layers 33, 32, and 31 and to reach the p-type well region 30p. On a side surface of the memory hole MH, a block insulating film 34, a charge storage layer 35 (which in one example is an insulating film), and a tunnel oxide film 36 are sequentially provided. In the memory hole MH, a semiconductor pillar 37 is embedded. The semiconductor pillar 37 is, for example, an undoped polysilicon and functions as a current path of the NAND strings NS. A wiring layer 38, which functions as the bit line BL, is provided at an upper end of the semiconductor pillar 37.

As described above, on an upper side of the p-type well region 30p, the select transistor ST2, the plurality of memory cell transistors MT, and the select transistor ST1 are sequentially stacked, and one memory hole MH corresponds to one NAND string NS.

At an upper part of the p-type well region 30p, an $n^+$-type impurity diffusion area 39 and a $p^+$-type impurity diffusion area 40 are provided. On an upper surface of the $n^+$-type impurity diffusion area 39, a contact plug 41 is provided. On an upper surface of the contact plug 41, a wiring layer 42 which functions as the source line CELSRC is provided. On the upper surface of the $p^+$-type impurity diffusion area 40, a contact plug 43 is provided. On the upper surface of the contact plug 43, a wiring layer 44 which functions as a well line CPWELL is provided.

Further, another configuration may be used as the configuration of the memory cell array 21. Other possible configurations of the memory cell array 21 are disclosed in, for example, U.S. patent application Ser. No. 12/407,403, entitled "three-dimensionally stacked nonvolatile semiconductor memory," filed on Mar. 19, 2009, U.S. patent application Ser. No. 12/406,524 entitled "three-dimensionally stacked nonvolatile semiconductor memory," filed on Mar. 18, 2009, U.S. patent application Ser. No. 12/679,991 entitled "nonvolatile semiconductor storage device and manufacturing method thereof" filed on Mar. 25, 2010, and U.S. patent application Ser. No. 12/532,030 entitled "semiconductor memory and manufacturing method thereof," filed on Mar. 23, 2009. All the above patent applications are incorporated by reference herein.

1.1.5 Configurations of Row Decoder and Driver Set

Subsequently, configurations of the row decoder and the driver set of the semiconductor storage device according to the first embodiment will be described.

1.1.5.1 Overview

First, configurations of the row decoder and the driver set of the semiconductor storage device according to the first embodiment will be described with reference to FIG. 5.

Figure 5:
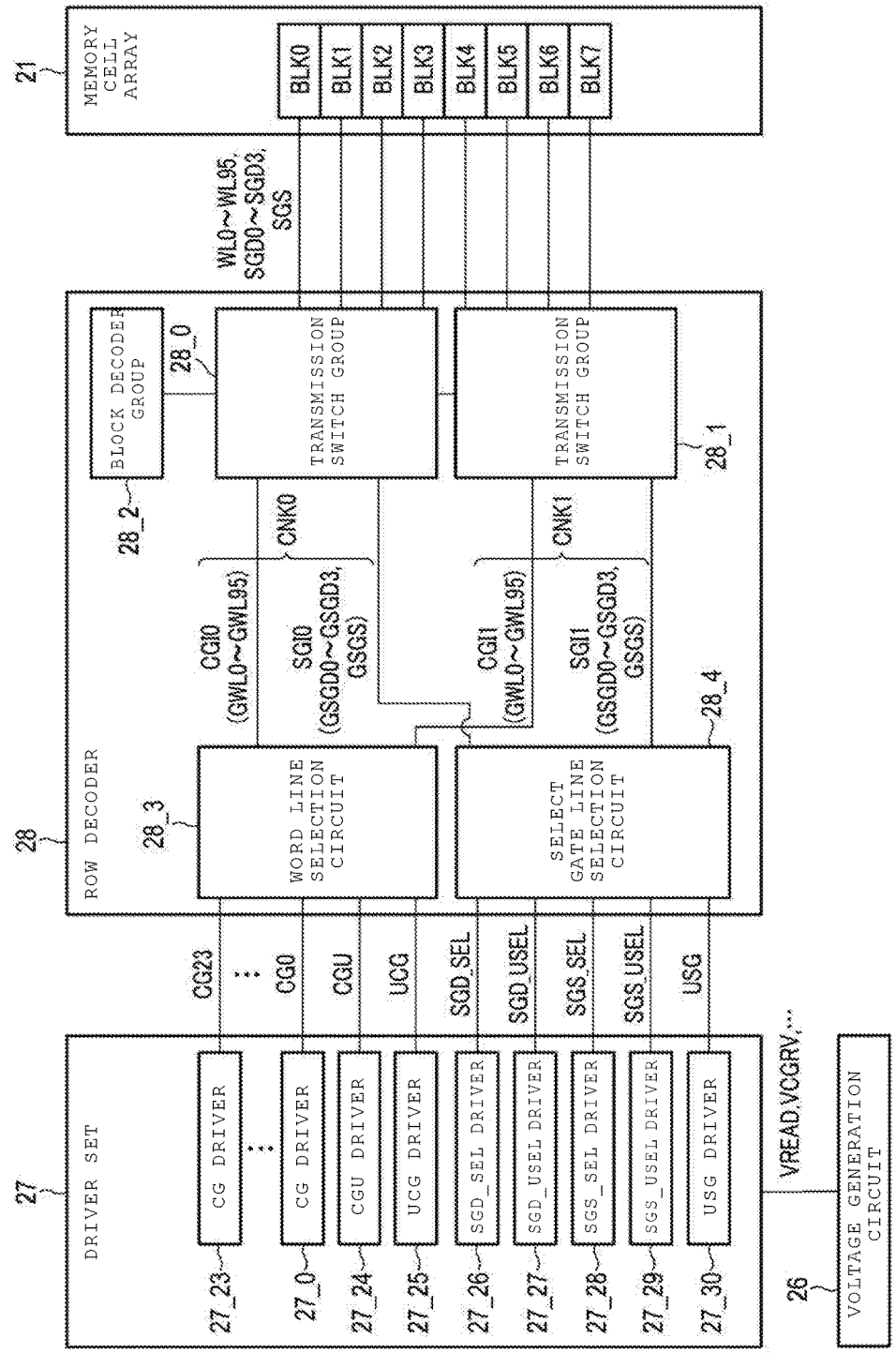
FIG. 5 is a block diagram illustrating an overview of configurations of a row decoder and a driver set of the semiconductor storage device according to the first embodiment.

FIG. 5 is a block diagram illustrating an overview of a configuration including the row decoder and the driver set of the semiconductor storage device according to the first embodiment. An example of FIG. 5 illustrates a case where the memory cell array 21 includes eight blocks BLK0 to BLK7.

As illustrated in FIG. 5, the row decoder 28 includes transmission switch groups 28_0 and 28_1, a block decoder group 28_2, a word line selection circuit 28_3, and a select gate line selection circuit 28_4.

The transmission switch group 28_0 is connected to, for example, each of the blocks BLK0 to BLK3. The transmission switch group 28_0 is connected to each of the blocks BLK0 to BLK3 via a set of the word lines WL0 to WL95, the select gate lines SGD0 to SGD3, and SGS, which are different from each other.

The transmission switch group 28_1 is connected to, for example, each of the blocks BLK4 to BLK7. The transmission switch group 28_1 is connected to each of the blocks BLK4 to BLK7 via a set of the word lines WL0 to WL95, the select gate lines SGD0 to SGD3, and SGS which are different from each other.

The block decoder group 28_2 is connected to the transmission switch groups 28_0 and 28_1, and outputs a block selection signal which selects relevant one of the blocks BLK with respect to each of the transmission switch groups 28_0 and 28_1. In the example of FIG. 5, the block decoder group 28_2 simultaneously selects one of the blocks BLK0 to BLK3 corresponding to the transmission switch group 28_0 and one of the blocks BLK4 to BLK7 corresponding to the transmission switch group 28_1 according to one block selection signal. Connection of the transmission switch groups 28_0 and 28_1 to the block decoder group 28_2 will be described in detail later.

Further, in the description below, description will be performed based on the configuration in which one block decoder group 28_2 is provided with respect to the transmission switch groups 28_0 and 28_1. However, a configuration in which one block decoder group 28_2 is provided for each of the transmission switch groups 28_0 and 28_1 may be employed.

The word line selection circuit 28_3 is connected to the transmission switch group 28_0 via a wiring group CGI0, and is connected to the transmission switch group 28_1 via the wiring group CGI1. Each of the wiring groups CGI0 and CGI1 includes, for example, 96 wirings GWL0 to GWL95. The word line selection circuit 28_3 will be described in detail later.

The select gate line selection circuit 28_4 is connected to the transmission switch group 28_0 via a wiring group SGI0, and is connected to the transmission switch group 28_1 via a wiring group SGI1. Each of the wiring groups SGI0 and SGI1 includes, for example, four wirings GSGD0 to GSGD3 and one wiring GSGS.

As described above, the blocks BLK0 to BLK7 are grouped into sets of blocks BLK which are connected by a set of the wiring groups CGI and SGI which are different from each other (in the example of FIG. 5, a set of the wiring group CGI0 and SGI0 or a set of the wiring groups CGI1 and SGI1). The set of the wiring groups CGI and SGI is also referred to as a "chunk CNK". For example, the set of the wiring groups CGI0 and SGI0 corresponds to chunk CNK0, and the set of the wiring groups CGI1 and SGI1 corresponds to chunk CNK1.

The driver set 27 includes, for example, CG drivers 27_0 to 27_23, a CGU driver 27_24, an UCG driver 27_25, an SGD_SEL driver 27_26, an SGD_USEL driver 27_27, an SGS_SEL driver 27_28, an SGS_USEL driver 27_29, and an USG driver 27_30.

The respective CG drivers 27_0 to 27_23, the CGU driver 27_24, and the UCG driver 27_25 are connected to the word line selection circuit 28_3 via wirings CG0 to CG23, CGU, and UCG.

The CG drivers 27_0 to 27_23 supply voltages to be applied to 24 wirings GWL corresponding to 24 word lines WL including a selected word line WL among the 96 wirings GWL, which are connected to a selected block BLK, in, for example, the read operation. The CGU driver 27_24 supplies voltages to be applied to 72 wirings GWL corresponding to 72 wirings GWL to which voltages are not supplied from the CG driver 27_0 to 27_23 among the 96 wirings GWL which are connected to the selected block BLK in, for example, the read operation. The UCG driver 27_25 supplies voltages to be applied to the wirings GWL which are not connected to the selected block BLK in, for example, the read operation. The CG drivers 27_0 to 27_23, the CGU driver 27_24, and the UCG driver 27_25 will be described in detail later.

The SGD_SEL driver 27_26, the SGD_USEL driver 27_27, the SGS_SEL driver 27_28, the SGS_USEL driver 27_29, and the USG driver 27_30 are connected to the select gate line selection circuit 28_4 via the wirings SGD_SEL, SGD_USEL, SGS_SEL, SGS_USEL, and USG, respectively.

The SGD_SEL driver 27_26 supplies a voltage to be applied to a wiring (one of the wiring GSGD0 to GSGD3) corresponding to the selected string unit SU among the wirings GSGD0 to GSGD3 which are connected to the selected block BLK in, for example, the read operation. The SGD_USEL driver 27_27 supplies voltages to be applied to wirings (three of the wiring GSGD0 to GSGD3) to which the voltage is not supplied from the SGD_SEL driver 27_28 among the wirings GSGD0 to GSGD3 which are connected to the selected block BLK in, for example, the read operation. The SGS_SEL driver 27_28 supplies a voltage to be applied to a wiring GSGS which is connected to the selected block BLK in, for example, the read operation. The SGS_USEL driver 27_29 supplies voltages to be applied to the wirings GSGS which are not connected to the selected block BLK in, for example, the read operation. The USG driver 27_30 supplies voltages to be applied to the wirings GSGD0 to GSGD3 which are not connected to the selected block BLK in, for example, the read operation.

The voltage generation circuit 26 generates voltages VREAD, VCGRV, and the like as voltages which are necessary for the word lines WL in, for example, the read operation. The generated voltages VREAD and VCGRV are transmitted to the various wirings CG0 to CG23, CGU, and UCG through, for example, the driver set 27. In addition, for example, the voltage generation circuit 26 generates voltages which are necessary for the select gate lines SGD and SGS, and transmits the generated voltages to the various wirings SGD_SEL, SGD_USEL, SGS_SEL, SGS_USEL, and USG via the driver set 27 in the read operation.

Further, the voltage VREAD is a voltage which is applied to non-selected word lines WL in the read operation, is a voltage which causes the memory cell transistor MT to be in an On state regardless of data stored therein, and is, for example, 8.0 V. The voltage VCGRV is a general term of voltages which are lower than the voltage VREAD, and voltages which have a plurality of sizes and which are applied to the selected word line WL in a case where the read operation is performed. Each of the voltages, which have the plurality of sizes, corresponds to the data stored therein, and causes the memory cell transistor MT to be in the ON state according to the data stored therein.

1.1.5.2 Configuration of Transmission Switch Group

Figure 6:
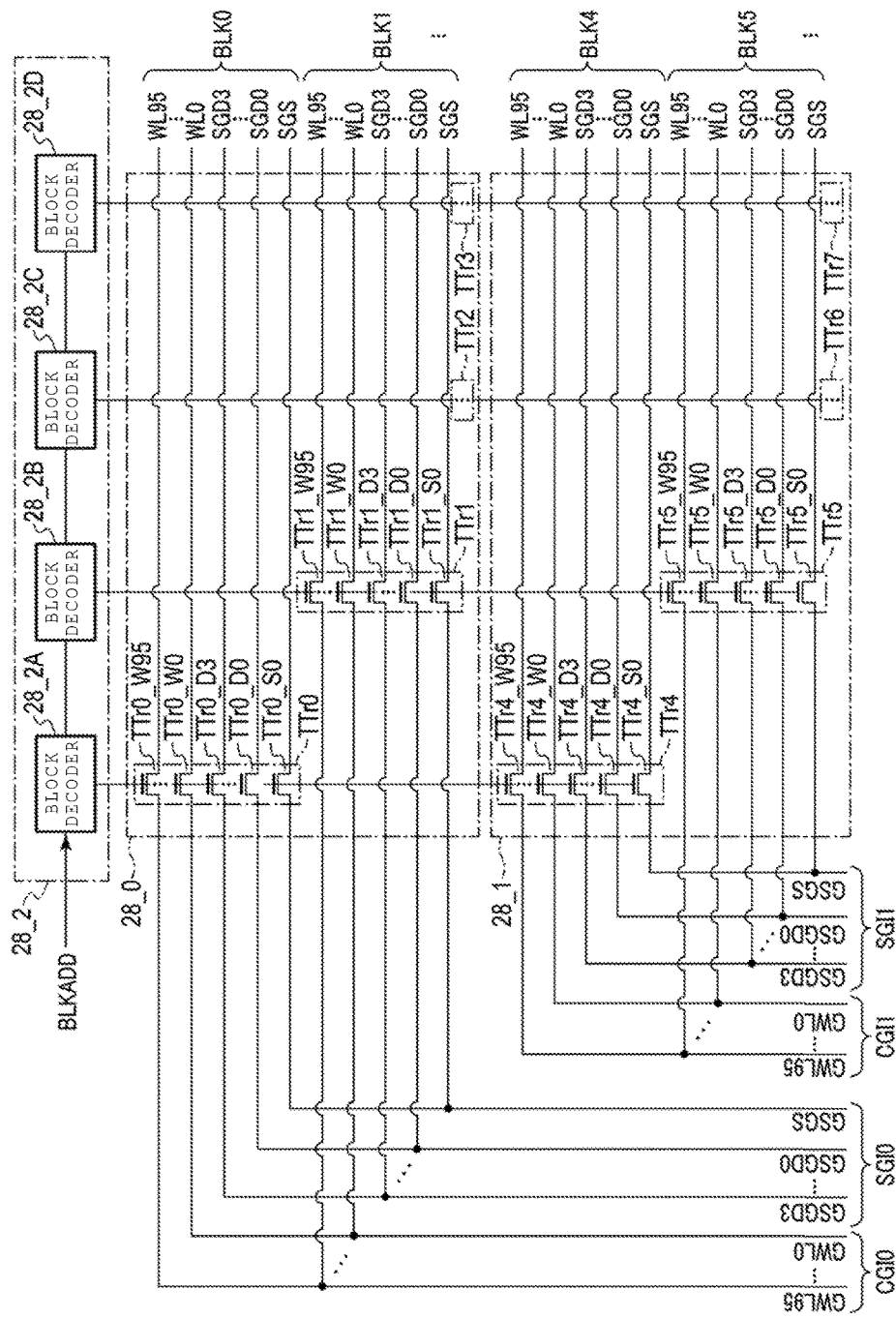
FIG. 6 is a circuit diagram illustrating configurations of a transmission transistor group and a block decoder group of the semiconductor storage device according to the first embodiment.

Subsequently, a configuration of the transmission switch group provided in the row decoder according to the first embodiment will be described with reference to FIG. 6. FIG. 6 is a circuit diagram illustrating configurations of the transmission switch group and the block decoder group of the semiconductor storage device according to the first embodiment.

As illustrated in FIG. 6, the block decoder group 28_2 includes, for example, four block decoders (28_2A, 28_2B, 28_2C, and 28_2D).

The transmission switch group 28_0 includes a plurality of transmission transistor groups TTr0, TTr1, TTr2, and TTr3. The transmission transistor groups TTr0 to TTr3 are provided to correspond to the blocks BLK0 to BLK3, respectively. More specifically, the transmission transistor group TTr0 includes transmission transistors TTr0_W0 to TTr0_W95, TTr0_D0 to TTr0_D3, and TTr0_S0. The transmission transistor group TTr1 includes transmission transistors TTr1_W0 to TTr1_W95, TTr1_D0 to TTr1_D3, and TTr1_S0.

In addition, the transmission switch group 28_1 includes a plurality of transmission transistor groups TTr4, TTr5, TTr6, and TTr7. The transmission transistor groups TTr4 to TTr7 are provided to correspond to the blocks BLK4 to BLK7, respectively. More specifically, the transmission transistor group TTr4 includes transmission transistors TTr4_W0 to TTr4_W95, TTr4_D0 to TTr4_D3, and TTr4_S0. The transmission transistor group TTr5 includes transmission transistors TTr5_W0 to TTr5_W95, TTr5_D0 to TTr5_D3, and TTr5_S0.

Further, although not illustrated in FIG. 6, the transmission transistor groups TTr2, TTr3, TTr6, and TTr7 have the same configurations as the transmission transistor groups TTr0, TTr1, TTr4, and TTr5.

Gates of the transmission transistor groups TTr0 and TTr4 are commonly connected to a block decoder 28_2A, and gates of the transmission transistor groups TTr1 and TTr5 are commonly connected to a block decoder 28_2B. In the same manner, gates of the transmission transistor groups TTr2 and TTr6 are commonly connected to a block decoder 28_2C, and gates of the transmission transistor groups TTr3 and TTr7 are commonly connected to a block decoder 28_2D.

Each of the block decoders 28_2A to 28_2D decodes address information (for example, a block address BLKADD). Furthermore, each of the block decoders 28_2A to 28_2D controls ON/OFF states of relevant transmission transistors according to a decoding result, and electrically connects the wirings GWL0 to GWL95, GSGD0 to GSGD3, and GSGS to the word lines WL0 to WL95 of a relevant block BLK and the select gate lines SGD0 to SGD3 and SGS.

More specifically, in a case where the block BLK0 is selected, the block decoder 28_2A causes the transmission transistor group TTr0 to be in the ON state and causes the transmission transistor group TTr4 to be in the ON state. Therefore, as a result, the block BLK4 is simultaneously selected together with the block BLK0. Further, in this case, other block decoders 28_2B, 28_2C, and 28_2D cause the transmission transistor groups TTr1 to TTr3 and TTr5 to TTr7 to be OFF states.

1.1.5.3 Configuration of Word Line Selection Circuit

Subsequently, a configuration of the word line selection circuit provided in the row decoder according to the first embodiment will be described with reference to FIG. 7.

Figure 7:
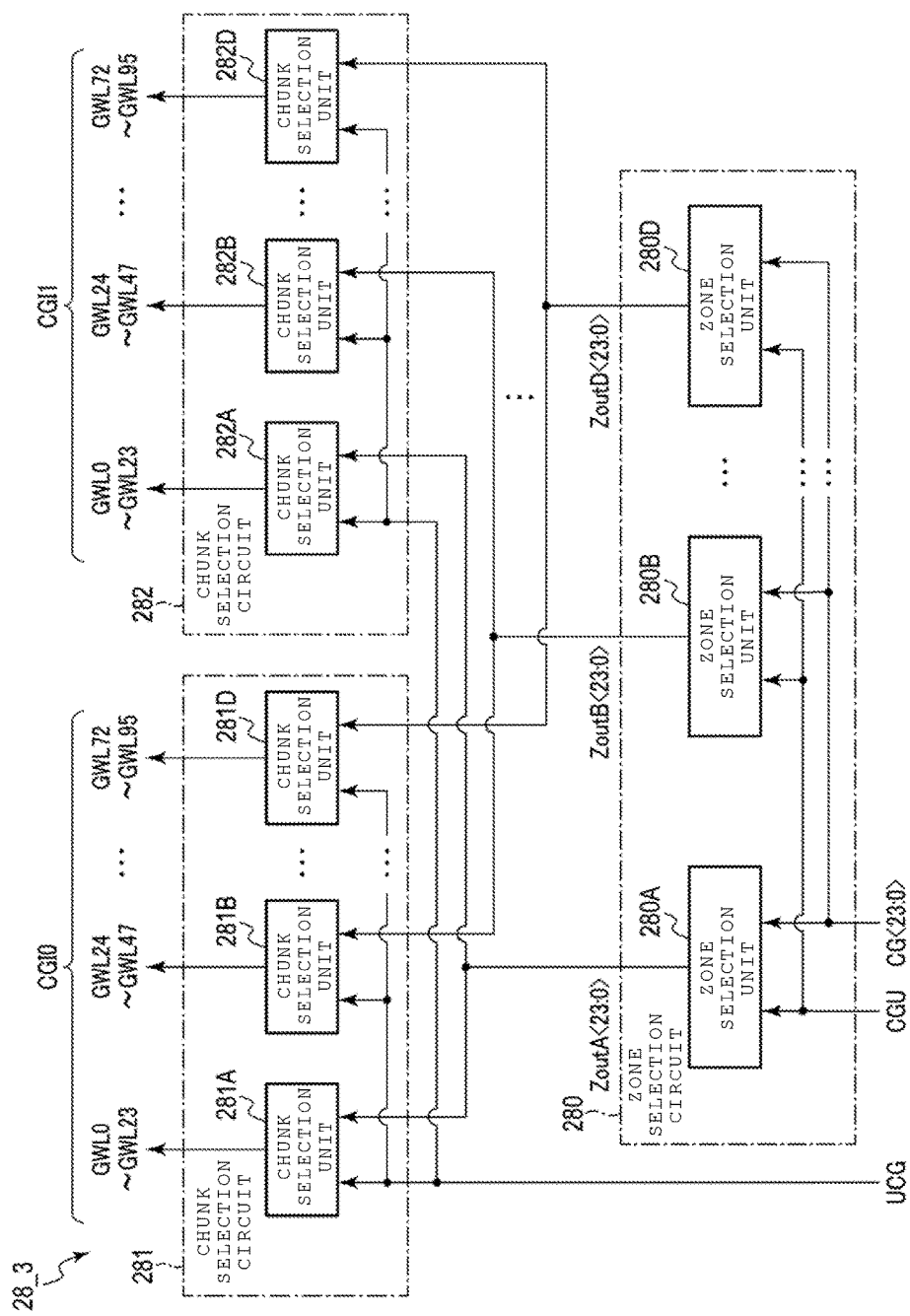
FIG. 7 is a block diagram illustrating a configuration of a selected word line circuit of the semiconductor storage device according to the first embodiment.

FIG. 7 is a block diagram illustrating the configuration of the word line selection circuit of the semiconductor storage device according to the first embodiment. As illustrated in FIG. 7, the word line selection circuit 28_3 includes a zone selection circuit 280 and chunk selection circuits 281 and 282.

The zone selection circuit 280 includes a plurality of input ends (in an example of FIG. 7, 25 input ends) which are connected to a wiring CG<23:0> and a wiring CGU, and a plurality of output ends (in the example of FIG. 7, 96 output ends). The plurality of output ends are respectively connected to nodes Zout (ZoutA<23:0>, ZoutB<23:0>, ZoutD<23:0>), and output a voltage of any one of the wiring CG<23:0> or the wiring CGU.

In addition, the zone selection circuit 280 includes a plurality of zone selection units (in the example of FIG. 7, four zone selection units 280A, 280B, . . . , 280D). Each of the zone selection units 280A to 280D includes the 25 input ends which are connected to the wiring CG<23:0> and the wiring CGU, and the 24 output ends which are respectively connected to the nodes ZoutA<23:0> to ZoutD<23:0>. The zone selection units 280A to 280D correspond to the zones Zn0 to Zn7, the zones Zn8 to Zn15, the zones Zn16 to Zn23, and the zones Zn24 to Zn31, respectively, and select relevant zones Zn, respectively.

The zone selection circuit 280 selects eight subsequent zones Zn which include the selected word line WL. More specifically, for example, in a case where the word line WL10 is selected, the word line WL is included in the zone Zn3. In this case, the zone selection circuit 280 outputs a voltage of the wiring CG<23:0> to the chunk selection circuits 281 and 282 via the node Zout corresponding to the eight subsequent selected zones Zn (for example, the zones Zn0 to Zn7) which include the zone Zn3. In addition, the zone selection circuit 280 outputs a voltage of the wiring CGU to the chunk selection circuits 281 and 282 via the node Zout corresponding to non-selected zones Zn (for example, the zones Zn8 to Zn31).

Each of the chunk selection circuits 281 and 282 includes the plurality of input ends (in the example of FIG. 7, the 97 input ends) which are connected to the plurality of output ends and the wiring UCG of the zone selection circuit 280, and a plurality of output ends (in the example of FIG. 7, the 96 output ends) which are connected to the wirings GWL0 to GWL95. More specifically, the output ends of the chunk selection circuit 281 are connected to the wirings GWL0 to GWL95 corresponding to the wiring group CGI0 of the chunk CNK0, and the output ends of the chunk selection circuit 282 are connected to the wirings GWL0 to GLW95 corresponding to the wiring group CGI1 of the chunk CNK1. The respective output ends of the chunk selection circuits 281 and 282 output a voltage of any one of the wiring CG<23:0> and the wiring CGU or UCG.

The chunk selection circuit 281 includes a plurality of chunk selection units (in the example of FIG. 7, four chunk selection units 281A, 281B, . . . , 281D). The chunk selection units 281A to 281D include total 25 input ends including input ends, which are respectively connected to the nodes ZoutA<23:0> to ZoutD<23:0>, and an input end connected to the wiring UCG. In addition, the chunk selection units 281A to 281D include 24 output ends which are connected to the wirings GWL0 to GWL23, GWL24 to GWL47, . . . GWL72 to GWL95 corresponding to the wiring group CGI0.

The chunk selection circuit 282 includes a plurality of chunk selection units (in the example of FIG. 7, four chunk selection units 282A, 282B, . . . , 282D). The chunk selection units 282A to 282D include total 25 input ends including input ends, which are respectively connected to the nodes ZoutA<23:0> to ZoutD<23:0> and the wiring UCG. In addition, the chunk selection units 282A to 282D include 24 output ends which are connected to the wirings GWL0 to GWL23, GWL24 to GWL47, . . . GWL72 to GWL95 corresponding to the wiring group CGI1.

In addition, the chunk selection circuits 281 and 282 select a chunk CNK which is connected to the selected block BLK. More specifically, for example, in a case where the block BLK3, which is the block BLK connected to the chunk CNK0, is selected, the chunk CNK0 corresponding to the wiring group CGI0 becomes a selected chunk CNK, and the chunk CNK1 corresponding to the wiring group CGI1 becomes a non-selected chunk CNK. In this case, the chunk selection circuit 281 outputs a voltage of the node Zout to the wiring group CGI0, and the chunk selection circuit 282 outputs a voltage of the wiring UCG to the wiring group CGI1.

1.1.5.4 Configurations of Zone Selection Unit and Chunk Selection Unit

Subsequently, configurations of the zone selection unit provided in the zone selection circuit and the chunk selection unit provided in the chunk selection circuit of the word line selection circuit according to the first embodiment will be described with reference to FIG. 8.

Figure 8:
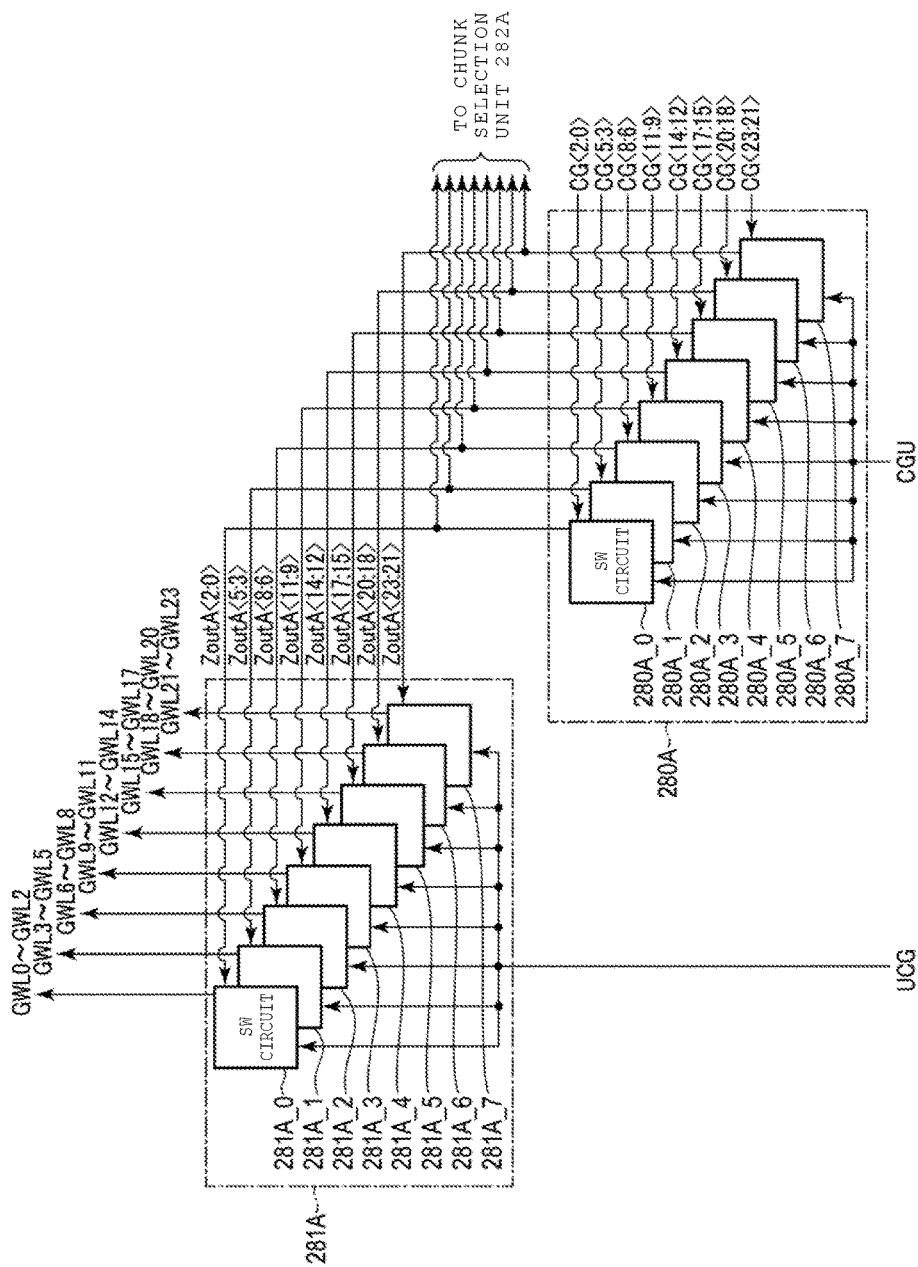
FIG. 8 is a block diagram illustrating configurations of a zone selection unit and a chunk selection unit of the semiconductor storage device according to the first embodiment.

FIG. 8 is a block diagram illustrating the configurations of the zone selection unit and the chunk selection unit of the semiconductor storage device according to the first embodiment. FIG. 8 illustrates a zone selection unit 280A and a chunk selection unit 281A as examples of the zone selection unit and the chunk selection unit.

Further, since the zone selection units 280B to 280D illustrated in FIG. 7 have the same configurations as the zone selection unit 280A, the description thereof will not be repeated. In addition, since the chunk selection units 281B to 281D and 282A to 282D illustrated in FIG. 7 have the same configurations as the chunk selection unit 281A, the description thereof will not be repeated.

As illustrated in FIG. 8, the zone selection unit 280A includes a plurality of switch circuits (in an example of FIG. 8, 8 switch circuits 280A_0 to 280A_7). Each of the switch circuits 280A_0 to 280A_7 includes an input end connected to the wiring CGU. In addition, the switch circuits 280A_0 to 280A_7 further include input ends respectively connected to wirings CG<2:0>, CG<5:3>, CG<8:6>, CG<11:9>, CG<14:12>, CG<17:15>, CG<20:18>, and CG<23:21>, and output ends respectively connected to nodes ZoutA<2:0>, ZoutA<5:3>, ZoutA<8:6>, ZoutA<11:9>, ZoutA<14:12>, ZoutA<17:15>, ZoutA<20:18>, and ZoutA<23:21>.

The switch circuits 280A_0 to 280A_7 respectively correspond to the zones Zn0 to Zn7. That is, in a case where the selected word line WL is included in the zones Zn corresponding to switch circuits 280A_0 to 280A_7, the switch circuits 280A_0 to 280A_7 output voltages of the wirings CG<2:0>, CG<5:3>, CG<8:6>, CG<11:9>, CG<14:12>, CG<17:15>, CG<20:18>, and CG<23:21>. In addition, in a case where the selected word line WL is not included in the zones Zn corresponding to switch circuits 280A_0 to 280A_7, the switch circuits 280A_0 to 280A_7 output the voltage of the wiring CGU.

The chunk selection unit 281A includes a plurality of switch circuits (in the example of FIG. 8, 8 switch circuits 281A_0 to 281A_7). Each of the switch circuits 281A_0 to 281A_7 includes an input end connected to the wiring UCG. In addition, the switch circuits 281A_0 to 281A_7 further include input ends respectively connected to the nodes ZoutA<2:0>, ZoutA<5:3>, ZoutA<8:6>, ZoutA<11:9>, ZoutA<14:12>, ZoutA<17:15>, ZoutA<20:18>, and ZoutA<23:21>, and output ends respectively connected to wirings GWL0 to GWL2, GWL3 to GWL5, GWL6 to GWL8, GWL9 to GWL11, GWL12 to GWL14, GWL15 to GWL17, GWL18 to GWL20, and GWL21 to GWL23.

In a case where the chunk CNK0 is selected, the switch circuits 281A_0 to 281A_7 respectively output voltages of the nodes ZoutA<2:0>, ZoutA<5:3>, ZoutA<8:6>, ZoutA<11:9>, ZoutA<14:12>, ZoutA<17:15>, ZoutA<20:18>, and ZoutA<23:21>. In addition, in a case where the chunk CNK0 is not selected, the switch circuits 281A_0 to 281A_7 output the voltage of the wiring UCG.

Figure 9:
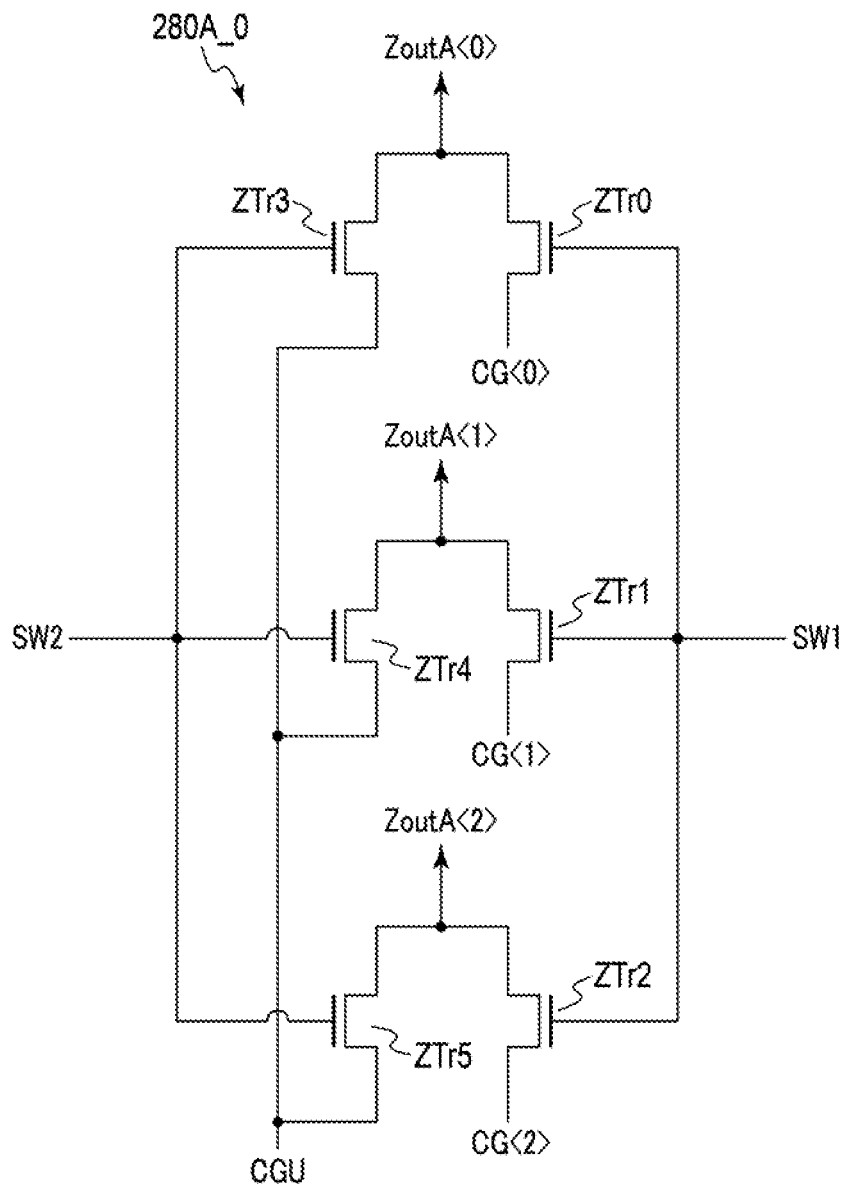
FIG. 9 is a circuit diagram illustrating a configuration of a switch circuit provided in the zone selection unit of the semiconductor storage device according to the first embodiment.

FIG. 9 is a circuit diagram illustrating a configuration of the switch circuit provided in the zone selection unit according to the first embodiment. FIG. 9 illustrates the switch circuit 280A_0 as an example of the switch circuit in the zone selection unit 280A. Further, since the switch circuits 280A_1 to 280A_7 illustrated in FIG. 8 have the same configuration as the switch circuit 280A_0, the description thereof will not be repeated.

As illustrated in FIG. 9, the switch circuit 280A_0 includes zone select transistors ZTr0 to ZTr5.

The respective zone select transistors ZTr0 to ZTr2 include first ends connected to wirings CG<0> to CG<2>, second ends connected to nodes ZoutA<0> to ZoutA<2>, and gates to which a signal SW1 is supplied.

The respective zone select transistors ZTr3 to ZTr5 include first ends connected to the wiring CGU, second ends connected to the nodes ZoutA<0> to ZoutA<2>, and gates to which a signal SW2 is supplied.

The signals SW1 and SW2 are signals which have logical levels different from each other, and which cause the zone select transistors ZTr0 to ZTr5 to be in the ON state in a case of the "H" level and cause the zone select transistors ZTr0 to ZTr5 to be in the OFF state in a case of the "L" level. That is, the signals SW1 and SW2 are respectively at the "H" level and the "L" level in a case where the selected word line WL is included in the relevant zone Zn (in an example of FIG. 9, the zone Zn0), and the signals SW1 and SW2 are respectively at the "L" level and the "H" level in a case where the selected word line WL is not included in the relevant zone Zn.

Figure 10:
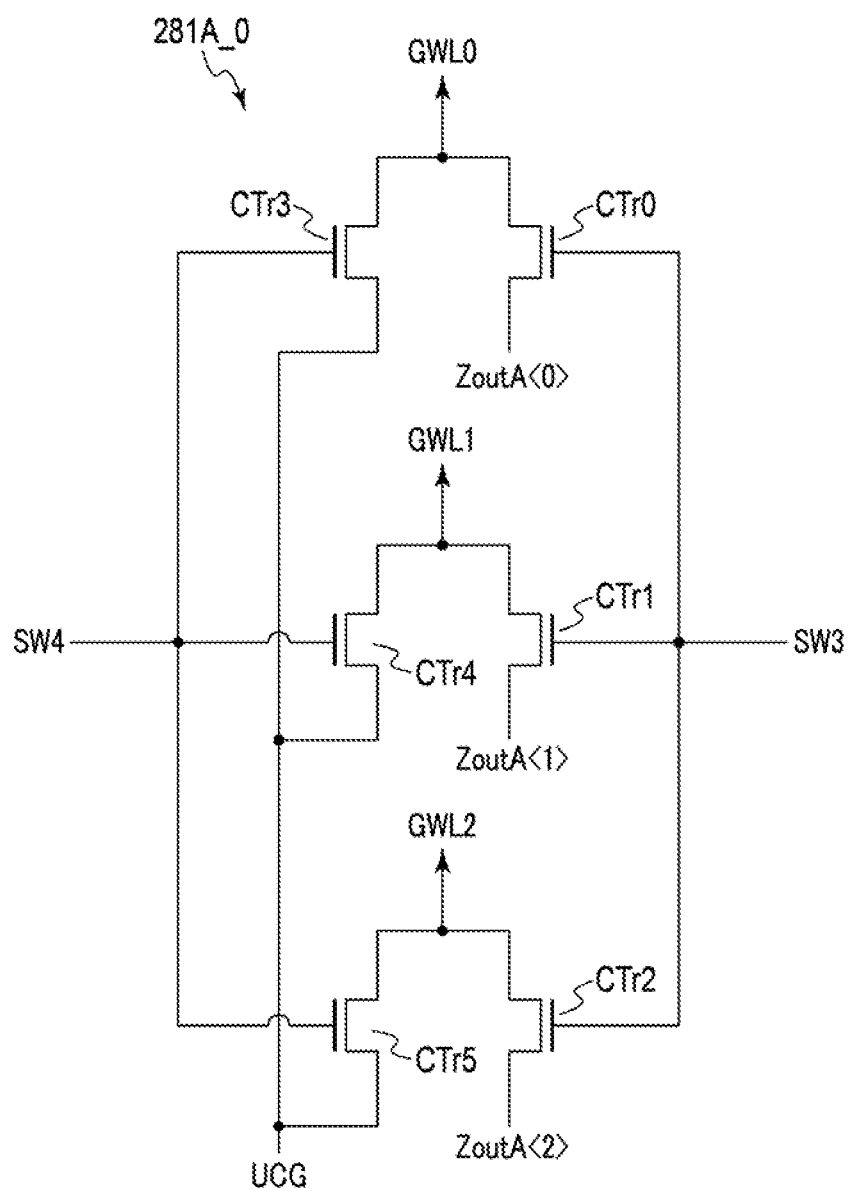
FIG. 10 is a circuit diagram illustrating a configuration of a switch circuit provided in the chunk selection unit of the semiconductor storage device according to the first embodiment.

FIG. 10 is a circuit diagram illustrating a configuration of the switch circuit of the chunk selection unit according to the first embodiment. FIG. 10 illustrates the switch circuit 281A_0 as an example of the switch circuit in the chunk selection unit 281A. Further, the switch circuits 281A 1 to 281A_7 illustrated in FIG. 8 have the same configuration as the switch circuit 281A_0, the description thereof will not be repeated.

As illustrated in FIG. 10, the switch circuit 281A_0 includes chunk select transistors CTr1 to CTr5.

The respective chunk select transistors CTr0 to CTr2 include first ends connected to the nodes ZoutA<0> to ZoutA<2>, second ends connected to the wirings GWL0 to GWL2, and gates to which a signal SW3 is supplied.

The respective chunk select transistors CTr3 to CTr5 include first ends connected to the wiring UCG, second ends connected to the wirings GWL0 to GWL2, and gates to which a signal SW4 is supplied.

The signals SW3 and SW4 are signals which have logical levels different from each other, and which cause the chunk select transistors CTr0 to CTr5 to be in the ON state in a case of the "H" level and cause the chunk select transistors CTr0 to CTr5 to be in the OFF state in a case of the "L" level. That is, the signals SW3 and SW4 are respectively at the "H" level and the "L" level in a case where a relevant chunk CNK (in an example of FIG. 10, the chunk CNK0) is selected, and the signals SW3 and SW4 are respectively at the "L" level and the "H" level in a case where the relevant chunk CNK is not selected.

1.1.5.5 Configuration of Driver Set

Figure 11:
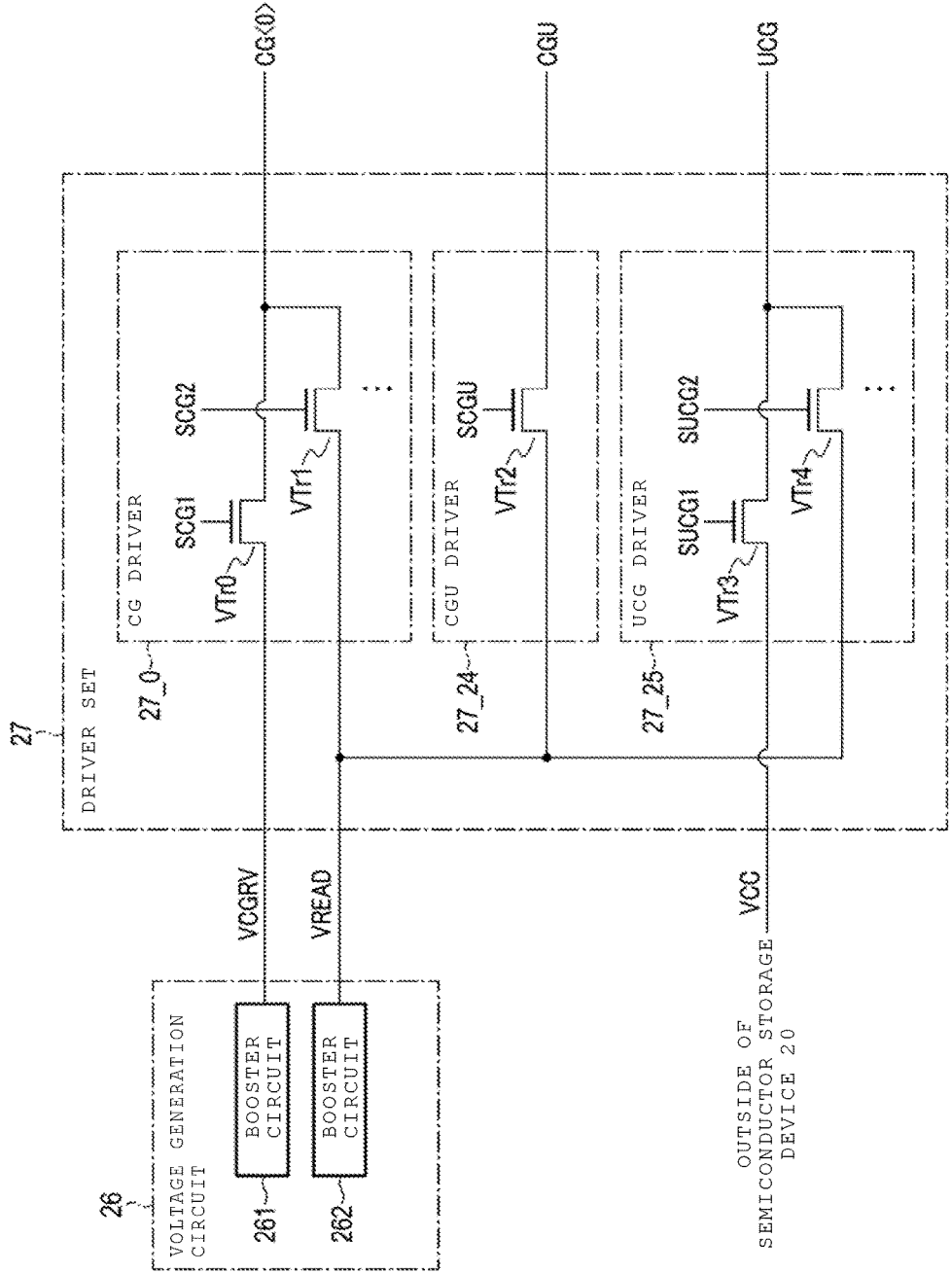
FIG. 11 is a circuit diagram illustrating a configuration of a driver set of the semiconductor storage device according to the first embodiment.

Subsequently, a configuration of the driver set of the semiconductor storage device according to the first embodiment will be described in detail. FIG. 11 is a circuit diagram illustrating the configuration of the driver set of the semiconductor storage device according to the first embodiment. FIG. 11 illustrates examples of configurations of the CG driver 27_0, the CGU driver 27_24, and the UCG driver 27_25 among the various drivers illustrated in FIG. 5. Further, the configurations of the CG drivers 27_1 to 27_23 are the same as the configuration of the CG driver 27_0, the description thereof will not be repeated.

As illustrated in FIG. 11, the voltage generation circuit 26 includes booster circuits 261 and 262 which are used when the read operation is performed. The booster circuits 261 and 262 respectively generate the voltages VCGRV and VREAD, and supply the generated voltages to the driver set 27. Further, the voltage generation circuit 26 may further include a booster circuit which is not illustrated in the drawing, may generate a voltage other than the voltages VCGRV and VREAD using the booster circuit which is not illustrated in the drawing, and may supply the generated voltage to the driver set 27.

The CG driver 27_0 selects any one of the voltages VCGRV and VREAD generated in the voltage generation circuit 26, and transmits the selected voltage to the wiring CG<0>. Specifically, for example, the CG driver 27_0 includes power select transistors VTr0 and VTr1. The power select transistor VTr0 includes a first end connected to an output end of the booster circuit 261, a second end connected to the wiring CG<0>, and a gate to which a signal SCG1 is supplied. The power select transistor VTr1 includes a first end connected to an output end of the booster circuit 262, a second end connected to the wiring CG<0>, and a gate to which a signal SCG2 is supplied.

The signals SCG1 and SCG2 are, for example, signals, one of which becomes the "H" level and the other one becomes the "L" level, and cause the power select transistors VTr0 and VTr1 to be in the ON state in a case of the "H" level and cause the power select transistors VTr0 and VTr1 to be in the OFF state in case of the "L" level. That is, the signal SCG1 outputs the "H" level in a case where the voltage VCGRV is transmitted to the wiring CG<0>, and outputs the "L" level in a case where the voltage VCGRV is not transmitted. The signal SCG2 outputs the "H" level in a case where the voltage VREAD is transmitted to the wiring CG<0>, and outputs the "L" level in a case where the voltage VREAD is not transmitted.

The CGU driver 27_24 selects the voltage VREAD generated in the voltage generation circuit 26, and transmits the voltage VREAD to the wiring CGU. Specifically, for example, the CGU driver 27_24 includes a power select transistor VTr2. The power select transistor VTr2 includes a first end connected to the output end of the booster circuit 262, a second end connected to the wiring CGU, and a gate to which a signal SCGU is supplied.

For example, the signal SCGU causes the power select transistor VTr2 to be in the ON state in a case of the "H" level, and causes the power select transistor VTr2 to be in the OFF state in a case of the "L" level. That is, the signal SCGU outputs the "H" level in a case where the voltage VREAD is transmitted to the wiring CGU, and outputs the "L" level in a case where the voltage VREAD is not transmitted.

The UCG driver 27_25 selects anyone of the voltage VREAD generated in the voltage generation circuit 26 and a voltage VCC supplied from the outside, and transmits the selected voltage to the wiring UCG. Specifically, for example, the UCG driver 27_25 includes power select transistors VTr3 and VTr4. The power select transistor VTr3 includes a first end connected to the output end of the booster circuit 262, a second end connected to the wiring UCG, and a gate to which a signal SUCG1 is supplied. The power select transistor VTr4 includes a first end connected to the voltage VCC, a second end connected to the wiring UCG, and a gate to which the signal SUCG2 is supplied. The voltage VCC is external power supplied from the outside of the semiconductor storage device 20. The voltage VCC has magnitude to the extent that does not affect the memory cell transistor MT even in a case where the voltage VCC is applied to the word line WL when the read operation is performed, and is lower than, for example, the voltage VREAD. More specifically, for example, the voltage VCC is 3.3 V.

The signals SUCG1 and SUCG2 are, for example, signals, one of which becomes the "H" level and the other one becomes the "L" level, and cause the power select transistors VTr3 and VTr4 to be in the ON state in the case of the "H" level, and cause the power select transistors VTr3 and VTr4 to be in the OFF state in the case of the "L" level. That is, the signal SUCG1 outputs the "H" level in the case where the voltage VCC is transmitted to the wiring UCG, and outputs the "L" level in the case where the voltage VCC is not transmitted. The signal SUCG2 outputs the "H" level in the case where the voltage VREAD is transmitted to the wiring UCG, and outputs the "L" level in the case where the voltage VREAD is not transmitted to the wiring UCG.

Further, the CG driver 27_0, the CGU driver 27_24, and the UCG driver 27_25 may further include a power select transistor which is capable of transmitting a voltage other than the voltages VCGRV, VREAD, and VCC, and which is not illustrated in the drawing. In any case, each of the CG driver 27_0, the CGU driver 27_24, and the UCG driver 27_25 causes any one of the internal power select transistors VTr to be ON state, and thus it is possible to transmit a specific voltage to the wirings CG<0>, CGU, and UCG.

1.2 Operation

Subsequently, an operation of the semiconductor storage device according to the first embodiment will be described.

1.2.1 Overview of Read Operation

Figure 12:
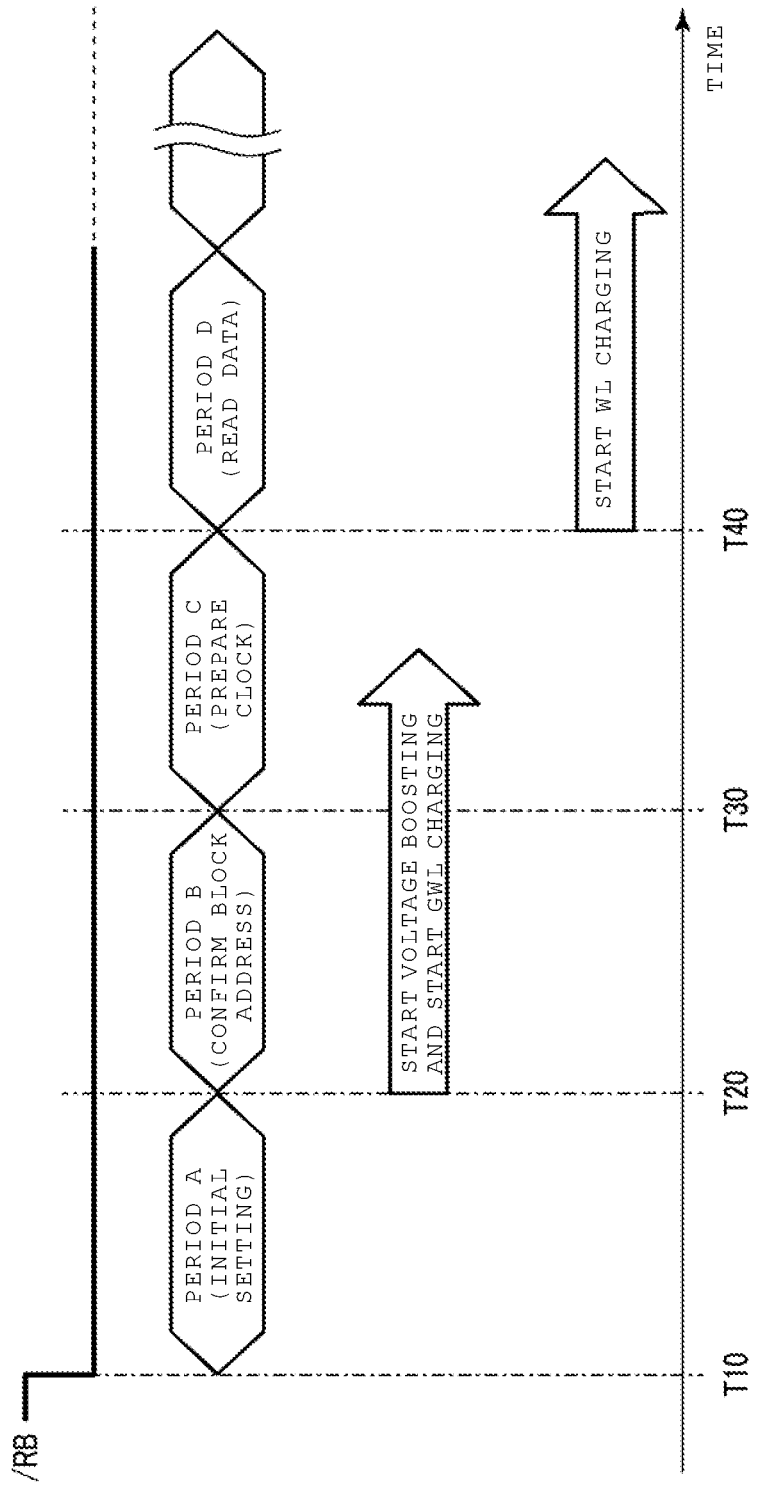
FIG. 12 is a schematic diagram illustrating an overview of a read operation performed in the semiconductor storage device according to the first embodiment.

First, an overview of the read operation which is performed in the semiconductor storage device according to the first embodiment will be described with reference to FIG. 12. In FIG. 12, the read operation is described while it is assumed that a start timing of the read operation is a point of time at which the signal/RB becomes the "L" level.

In the example of FIG. 12, the read operation is classified into four or more periods (a period A, a period B, a period C, a period D, . . . ). For example, the period A ranges from time T10 to time T20, the period B ranges from time T20 to time T30, the period C ranges from time T30 to time T40, and the period D is a period subsequent to time T40.

As illustrated in FIG. 12, at time T10, the logic control circuit 23 notifies the controller 10 of the signal/RB at the "L" level according to a read command from the controller 10. Therefore, the read operation starts in the semiconductor storage device 20.

In the period A, the sequencer 25 initializes settings which are necessary for the read operation.

At time T20, the read operation is transitioned from the period A to the period B when the initial setting ends. In period B, the sequencer 25 causes the row decoder 28 to confirm the block address BLKADD based on the address ADD received from the controller 10. That is, block BLK to be selected is not confirmed yet during the period B.

In addition, the sequencer 25 instructs the voltage generation circuit 26 to generate a high voltage (for example, voltage VREAD) which is necessary for the read operation. As a result, at time T20, the booster circuit 262 starts boosting to the voltage VREAD.

Further, the sequencer 25 electrically connects the booster circuit 262 to the wiring UCG via the UCG driver 27_25 during the period B. In addition, the sequencer 25 electrically connects the wiring UCG to all the wirings GWL in the wiring groups CGI0 and CGI1 via the chunk selection circuits 281 and 282. Therefore, all the wirings GWL are charged up to the voltage VREAD according to the boosting performed by the booster circuit 262.

At time T30, the read operation is transitioned from the period B to the period C with the confirmation of the block address BLKADD. In the period C, the sequencer 25 starts preparing a block which is necessary for the read operation. In the period C, the sequencer 25 may continue to charge all the wirings GWL by the voltage VREAD subsequent to the period B.

At time T40, the read operation is transitioned from the period C to the period D with the end of preparation of a clock. In the period D, the sequencer 25 instructs the voltage generation circuit 26 to generate a low voltage (for example, voltage VCGRV) which is necessary for the read operation. As a result, at time T40, the booster circuit 261 starts boosting to the voltage VCGRV. As described above, the voltage VCGRV is lower than the voltage VREAD. Therefore, the boosting to the voltage VCGRV by the booster circuit 261 is rapidly completed rather than the boosting to the voltage VREAD by the booster circuit 262. Further, as described above, the booster circuit 262 starts charging from time T20 prior to time T40. Therefore, at time T40, the boosting performed by the booster circuit 262 on all the wirings GWL to the voltage VREAD has already completed or is almost completed.

Further, since the block address BLKADD is confirmed by time T40, it is possible to designate the selected block BLK and the selected word line WL. Therefore, the sequencer 25 electrically connects the booster circuit 261 to the wirings CG<23:0> and CGU via the CG drivers 27_0 to 27_23 and the CGU driver 27_24. In addition, the sequencer 25 electrically connects the wirings CG<23:0> and CGU to the wiring group CGI corresponding to the selected chunk CNK via the zone selection circuit 280 and the chunk selection circuit 281 or 282. In addition, the sequencer 25 electrically connects the wiring group CGI corresponding to the selected chunk CNK to the word lines WL in the selected block BLK via a relevant block decoder. Therefore, the word lines WL in the selected block BLK are charged up to a voltage which is necessary for reading, and thus data is read.

Hereinabove, the data read operation ends.

1.2.2 Timing Chart

Figure 13:
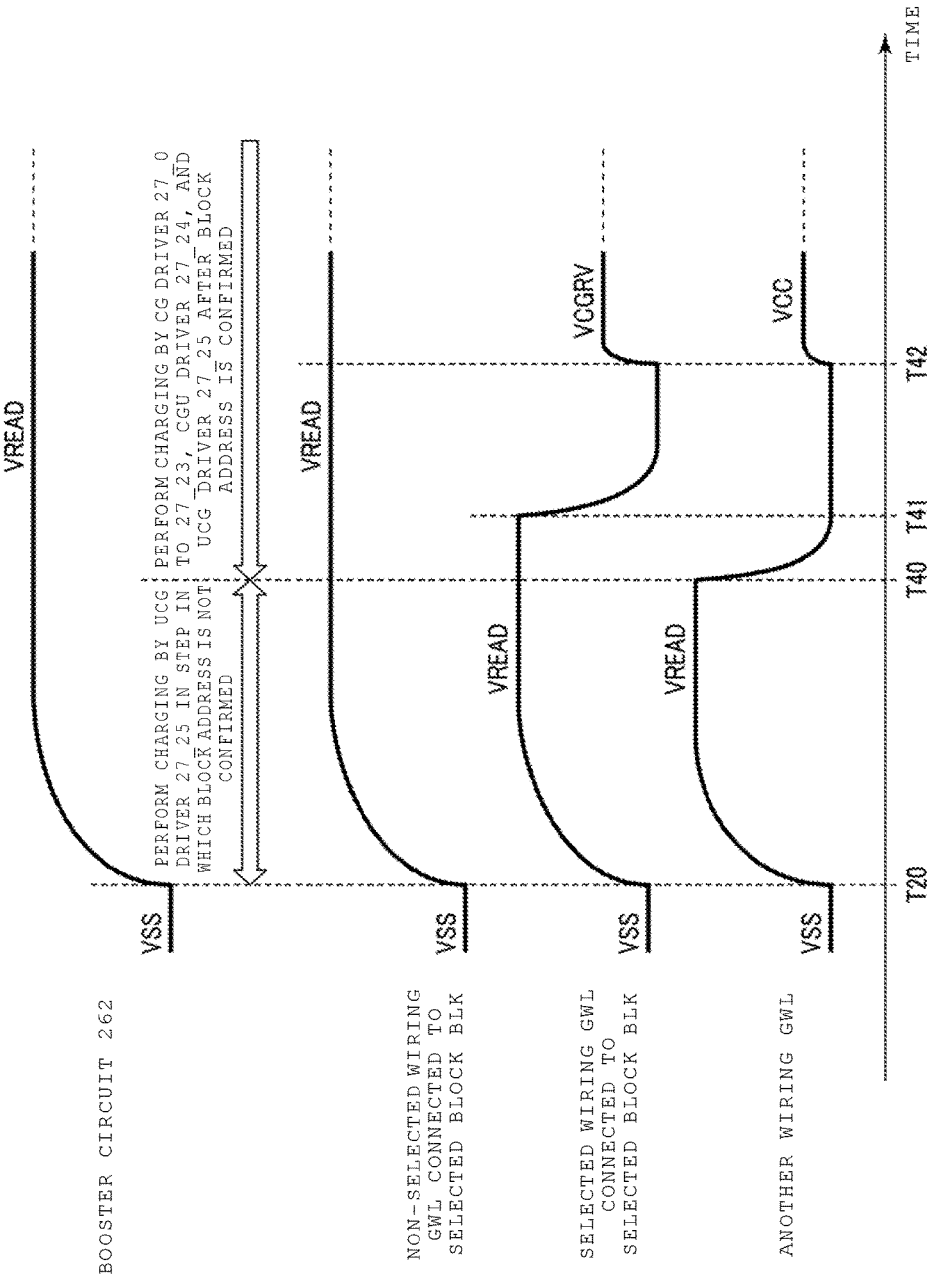
FIG. 13 is a timing chart illustrating the read operation performed in the semiconductor storage device according to the first embodiment.

Subsequently, a timing chart of the read operation performed in the semiconductor storage device according to the first embodiment will be described with reference to FIG. 13. FIG. 13 illustrates changes in the voltages of the booster circuit 262 and the wirings GWL after time T20 of the read operation. In addition, in FIG. 13, the wirings GWL are divided into three types, that is, a wiring GWL (hereinafter, referred to as a "selected wiring GWL connected to the selected block BLK") corresponding to the selected word line WL of the wirings GWL connected to the selected block BLK, a wiring GWL (hereinafter, referred to as a "non-selected wiring GWL connected to the selected block BLK") corresponding to a non-selected word line WL among wirings GWL connected to the selected block BLK, and wirings GWL (hereinafter, referred to as "other wirings GWL") other than the wiring GWL connected to the selected block BLK. In addition, in a case where all the three types are included, the wirings are referred to as "all wirings GWL".

As illustrated in FIG. 13, at time T20, the booster circuit 262 starts boosting to the voltage VREAD from a voltage VSS (for example, 0 V).

As described above, since which block BLK is the selected block BLK is not confirmed at time T20, it is difficult to transmit different voltages for each wiring group CGI or for each wiring GWL. However, it is possible to transmit the same voltage to all the wirings GWL of the entire wiring group CGI. Therefore, the sequencer 25 electrically connects the booster circuit 262 to all the wirings GWL via the UCG driver 27_25. Therefore, all the wirings GWL are charged substantially simultaneously with the booster circuit 262 by the voltage VREAD. Here, "substantially simultaneously" means that a difference in timings of the voltage increases between the booster circuit 262 and the wiring GWL is within dozens of nanoseconds (ns). The difference in rising timings of the voltages includes delays caused by resistance elements, such as the UCG driver 27_25 and the chunk selection circuit 281, existing between the booster circuit 262 and the wirings GWL.

In addition, since the booster circuit 262 starts the boosting in a state of being electrically connected to all the wirings GWL, gradients of voltage increase of all the wirings GWL are equivalent to a gradient of voltage increase of the booster circuit 262. The gradients of voltage increase of all the wirings GWL are steeper compared to a gradient of the voltage increase in a case where the boosting starts in a state (that is, a state in which resistance loads corresponding to the word lines WL are further added) of being further electrically connected to the word lines WL via the transmission switch group 28_0 or 28_1. As a result, the voltage VREAD is more rapidly reached.

At time T40, which block BLK is the selected block BLK is confirmed. As a result, the sequencer 25 electrically connects the booster circuit 262 to all the wirings GWL, which are connected to the selected block BLK, via the CG drivers 27_0 to 27_23 and the CGU driver 27_24. Therefore, the voltage VREAD is subsequently transmitted to all the wirings GWL connected to the selected block BLK. In contrast, the sequencer 25 electrically disconnects the booster circuit 262 from other wirings GWL, and causes the voltage of other wirings GWL to be discharged to the voltage VSS.

At time T41, the sequencer 25 electrically disconnects the booster circuit 262 from the selection wiring GWL connected to the selected block BLK, and causes the voltage of the selected wiring GWL connected to the selected block BLK to be discharged to the voltage VSS.

At time T42, the sequencer 25 electrically connects the booster circuit 261 to the selected wiring GWL connected to the selected block BLK via any one of the CG driver 27_0 to 27_23. Therefore, the selected wiring GWL connected to the selected block BLK is charged by the voltage VCGRV. In addition, the sequencer 25 electrically connects other wirings GWL to the external power via the UCG driver 27_25. Therefore, other wirings GWL are charged by the voltage VCC.

Further, at a point of time T42, non-selected wirings GWL connected to the selected block BLK are completely charged by the voltage VREAD. Therefore, subsequent to time T42, data from the selected block BLK is read.

1.3 Advantage According to First Embodiment

According to the first embodiment, it is possible to reduce the time which is required to read data. The advantage will be described below.

The voltage VREAD has a voltage value which is larger than that of another voltage VCRV or the like. In addition, since the non-selected wirings GWL connected to the selected block BLK have the majority of 96 wirings GWL, loads for charging are also large. Therefore, long time is necessary to perform charging by the voltage VREAD rather than charging by the voltage VCRV or the like.

In the read operation, the semiconductor storage device according to the first embodiment starts charging all the wirings GWL of all the wiring groups CGI by the voltage VREAD from time T20, that is, before the block address is confirmed. Therefore, it is possible to start charging the wirings GWL, which are scheduled to be charged by the voltage VREAD, by the voltage VREAD at timing earlier than timing which starts charging by the voltage VREAD after the block address is confirmed. Therefore, at time T42, that is, after the block address is confirmed, it is possible to complete the charging by the voltage VREAD, and it becomes possible to read the data. Accordingly, it is possible to reduce time which is required to read the data.

In addition, timing at which the booster circuit 262 performs boosting is substantially simultaneous with timing at which the wiring group CGI is charged. Therefore, it is possible to bring forward the timing at which the wiring group CGI is charged, and, eventually, it is possible to reduce the time which is required to read the data.

Further, the wiring group CGI is charged by the voltage VREAD in a state of being electrically disconnected from the word lines WL. Therefore, it is possible to reduce the loads in a case where the wiring group CGI is charged, rather than the case where charging is performed in a state of being electrically connected to the word lines WL. Therefore, the gradient of the voltage increase due to the boosting performed by the booster circuit 262 is equivalent to a gradient of the voltage increase due to the charging of the wiring group CGI.

In addition, the wiring group CGI is charged by the voltage VREAD via a path which passes via the UCG driver 27_25 instead of a path which passes via the CG drivers 27_0 to 27_23 or the CGU driver 27_24.

Figure 14:
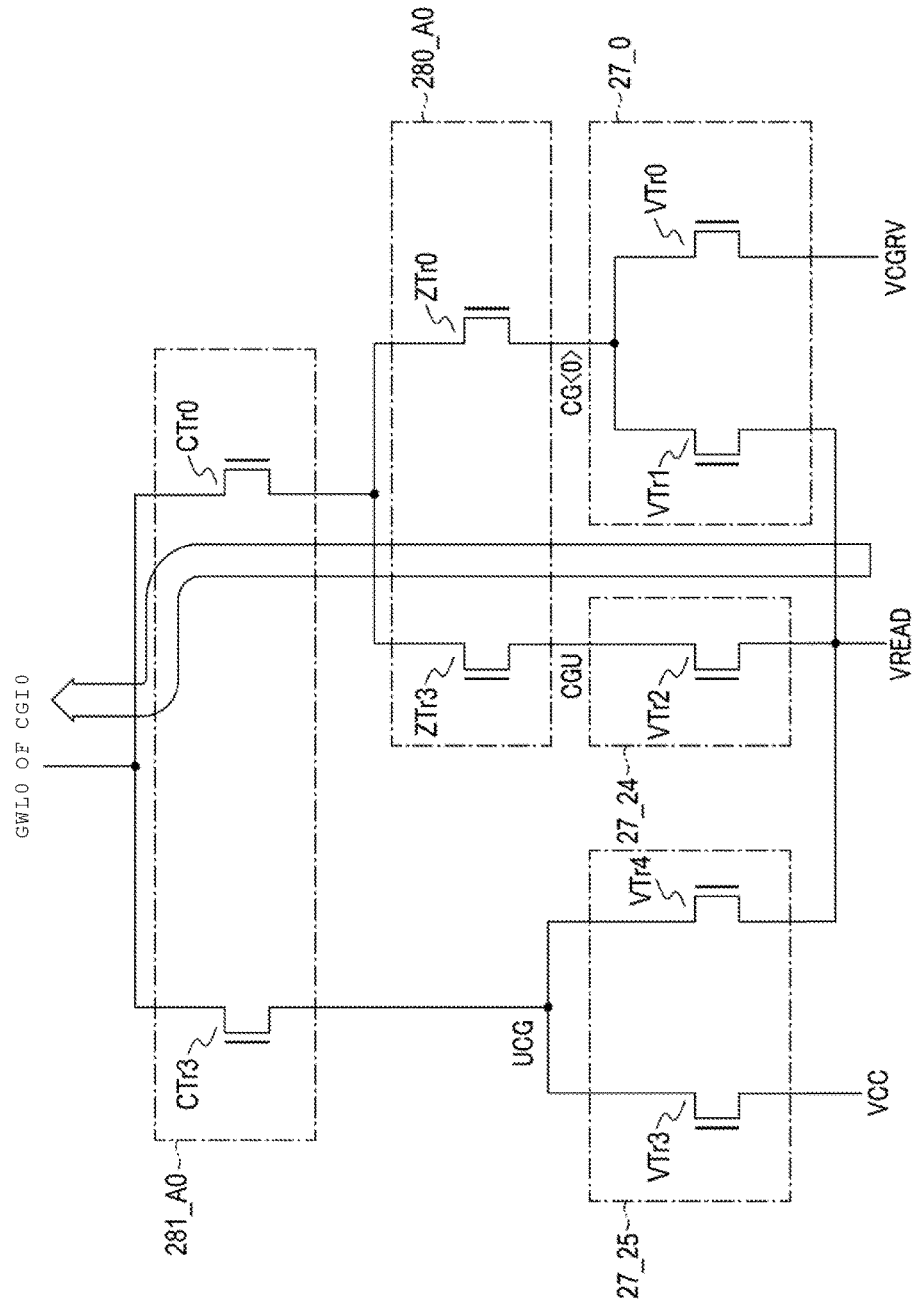
FIG. 14 is a circuit diagram illustrating a charging route of wiring when a read operation is performed in a comparative example.
Figure 15:
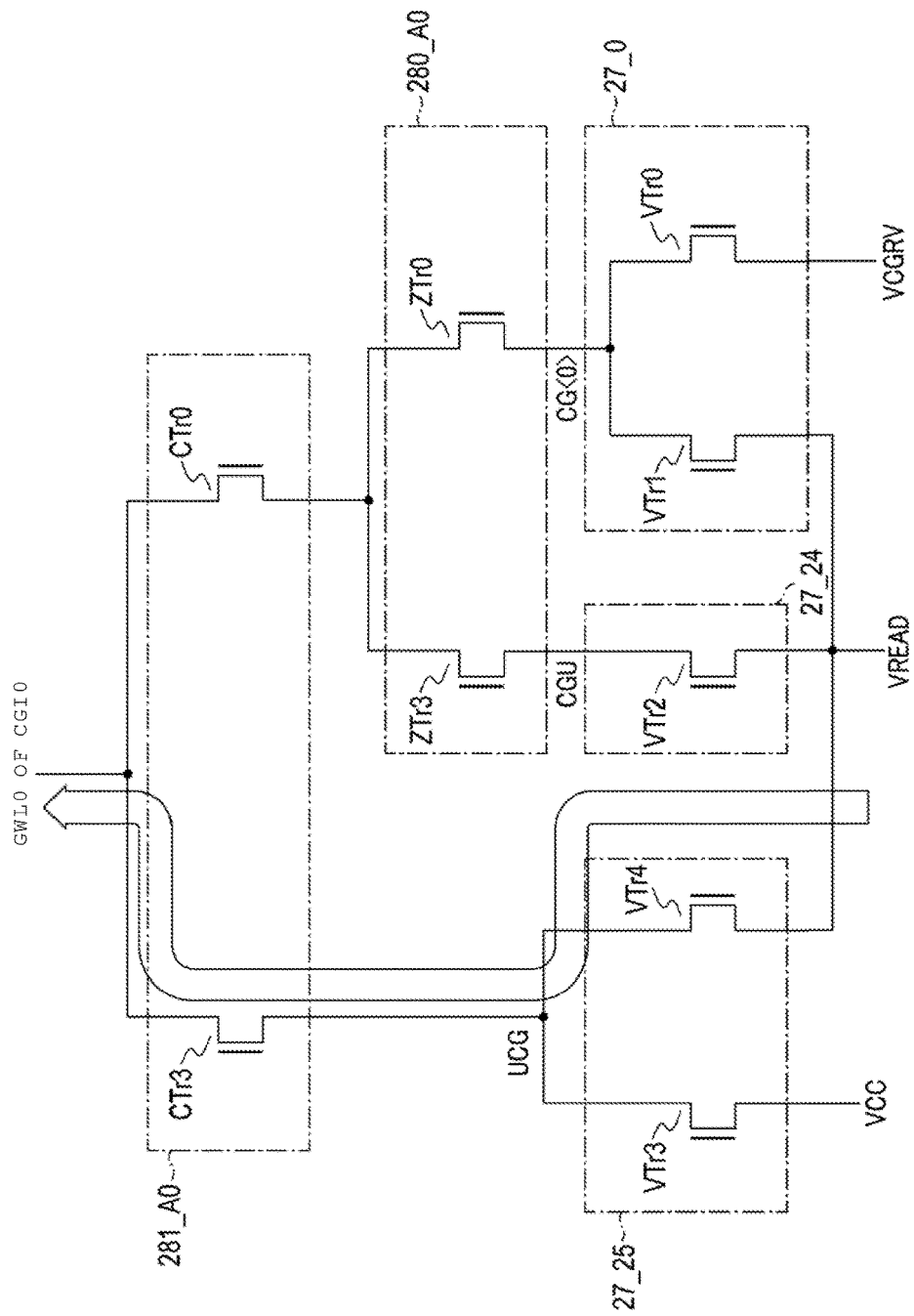
FIG. 15 is a circuit diagram illustrating a charging route of wiring when the read operation is performed in the semiconductor storage device according to the first embodiment.

FIG. 14 is a circuit diagram illustrating a wiring charging route when a read operation is performed in a comparative example. FIG. 15 is a circuit diagram illustrating a wiring charging route when the read operation is performed in the semiconductor storage device according to the first embodiment. FIGS. 14 and 15 schematically illustrate routes of charging or transmitting the voltage VREAD in a case where the wiring GWL0 of the wiring group CGI0 becomes the non-selected wiring GWL connected to the selected block BLK as an example of the read operation. Specifically, FIG. 14 illustrates a route in a case where the wiring GWL0 of the wiring group CGI0 is charged by the voltage VREAD via the CG driver 27_0 or the CGU driver 27_24. FIG. 15 illustrates a route in a case where the wiring GWL0 of the wiring group CGI0 is charged by the voltage VREAD via the UCG driver 27_25.

As illustrated in FIG. 14, in a case where the voltage VREAD is transmitted to the wiring GWL0 of the wiring group CGI0, the voltage VREAD is transmitted via three switch circuits, that is, the power transmission transistor VTr1 or VTr2, the zone select transistor ZTr0 or VTr3, and the chunk select transistor CTr0 in the route passing via the CG driver 27_0 or the CGU driver 27_24.

In contrast, as illustrated in FIG. 15, it is possible to transmit the voltage VREAD via two switch circuits, that is, the power transmission transistor VTr4 and the chunk select transistor CTr3 in the route passing via the UCG driver 27_25. In this manner, the route passing via the UCG driver 27_25 does not pass via the switch circuit 280_A0 in the zone selection unit 280A, and thus it is possible to charge the wiring GWL0 via a fewer number of switch circuits. Therefore, it is possible to reduce the loads when charging is performed, and, eventually, it is possible to reduce time which is required to perform charging up to the voltage VREAD. Therefore, it is possible to reduce time which is required to read the data.

2. Second Embodiment

Subsequently, a semiconductor storage device according to a second embodiment will be described. In the semiconductor storage device according to the first embodiment, all the wiring groups CGI are charged by the voltage VREAD before the block address is confirmed. In contrast, in the semiconductor storage device according to the second embodiment, all the wiring groups CGI are charged by a voltage, which is lower than the voltage VREAD, before the block address is confirmed. In the following, the same symbols are attached to the same components as in the first embodiment, the description thereof will not be repeated, and only parts which are different from the first embodiment will be described.

2.1 Configuration of Driver Set

Figure 16:
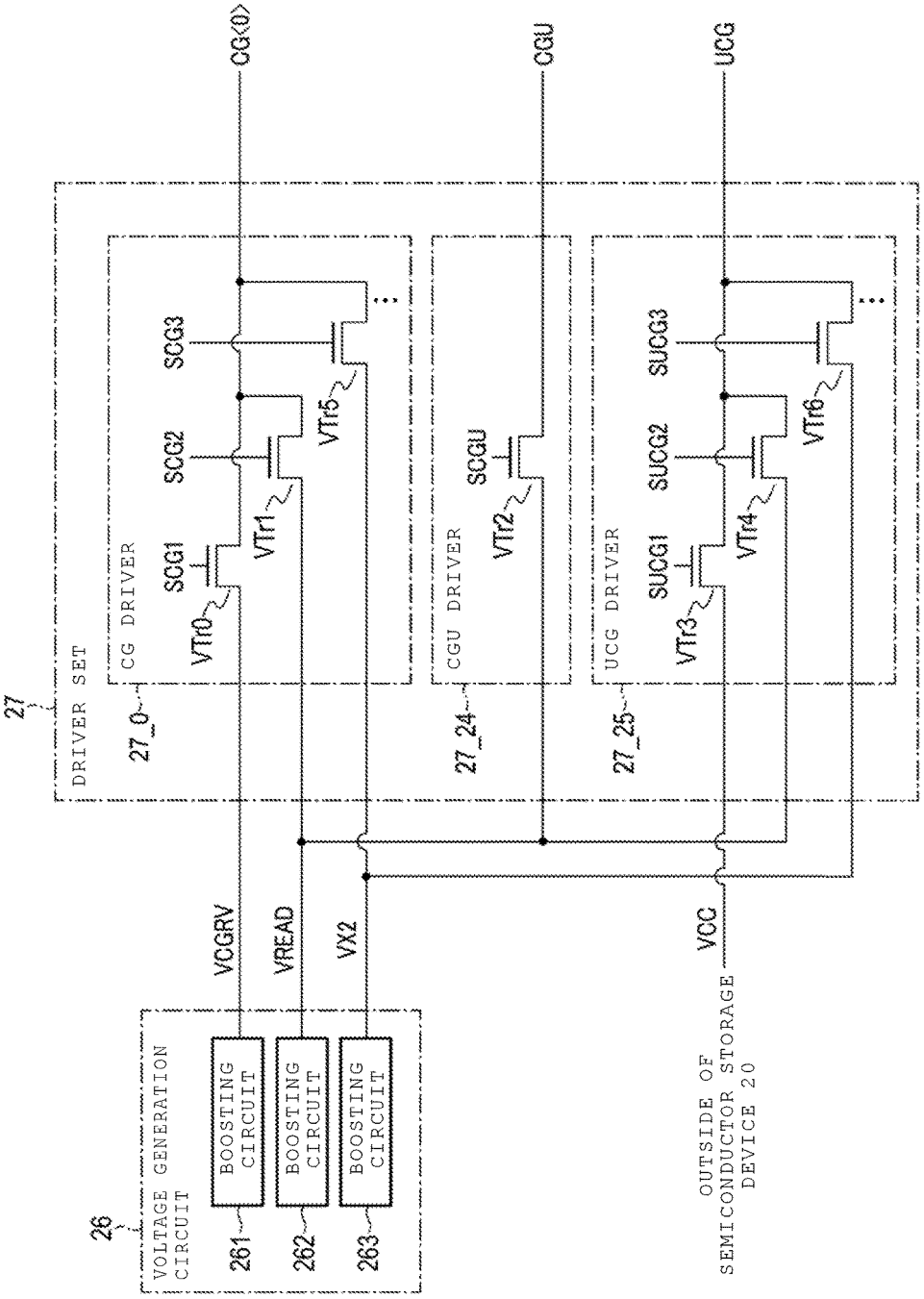
FIG. 16 is a circuit diagram illustrating a configuration of a driver set of a semiconductor storage device according to a second embodiment.

FIG. 16 is a circuit diagram illustrating a configuration of a driver set of the semiconductor storage device according to the second embodiment. FIG. 16 corresponds to FIG. 11 described in the first embodiment.

As illustrated in FIG. 16, the voltage generation circuit 26 further includes a booster circuit 263. The booster circuit 263 generates a voltage VX2, and supplies the voltage VX2 to the driver set 27. The voltage VX2 has magnitude to the extent that does not affect the memory cell transistor MT even in a case where the voltage VX2 is applied to the word line WL when the read operation is performed, and is lower than the voltage VREAD. More specifically, for example, the voltage VX2 is 4.0 V.

The CG driver 27_0 selects anyone of the voltages VCGRV, VREAD, and VX2 generated by the voltage generation circuit 26, and transmits the selected voltage to the wiring CG<0>. Specifically, for example, the CG driver 27_0 further includes a power select transistor VTr5. The power select transistor VTr5 includes a first end connected to an output end of the booster circuit 263, a second end connected to the wiring CG<0>, and a gate to which a signal SCG3 is supplied.

The signals SCG1 to SCG3 include, for example, any one signal at the "H" level and the remaining two signals at the "L" level. The signal SCG3 causes the power select transistor VTr5 to be in the ON state in a case of the "H" level and to be in OFF state in a case of the "L" level. That is, the signal SCG3 outputs the "H" level in a case where the voltage VX2 is transmitted to the wiring CG<0>, and outputs the "L" level in a case where the voltage VX2 is not transmitted.

The UCG driver 27_25 selects any one of the voltages VREAD and VX2, generated by the voltage generation circuit 26, and the voltage VCC, and transmits the selected voltage to the wiring UCG. Specifically, for example, the UCG driver 27_25 further includes a power select transistor VTr6. The power select transistor VTr6 includes a first end connected to the output end of the booster circuit 263, a second end connected to the wiring UCG, and a gate to which a signal SUCG3 is supplied.

The signals SUCG1 to SUCG3 include, for example, any one signal at the "H" level and the remaining two signals at the "L" level. The signal SUCG3 outputs the "H" level in a case where the voltage VX2 is transmitted to the wiring UCG, and outputs the "L" level in a case where the voltage VX2 is not transmitted.

2.2 Read Operation

Subsequently, a read operation of the semiconductor storage device according to the second embodiment will be described.

Figure 17:
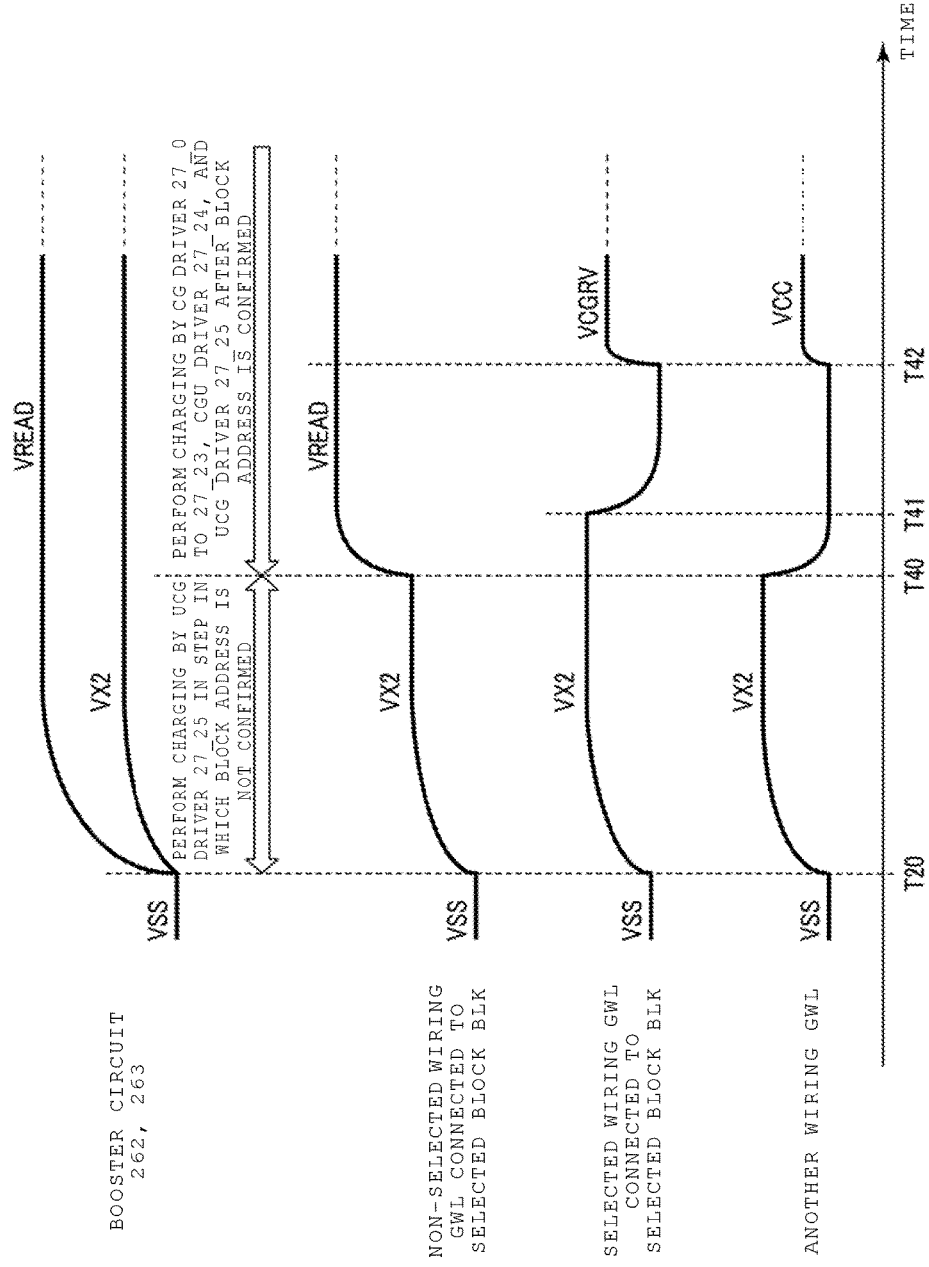
FIG. 17 is a timing chart illustrating a read operation performed in the semiconductor storage device according to the second embodiment.

FIG. 17 is a timing chart illustrating the read operation performed by the semiconductor storage device according to the second embodiment. FIG. 17 corresponds to FIG. 13 described in the first embodiment.

As illustrated in FIG. 17, at time T20, the booster circuits 262 and 263 start boosting to the voltages VREAD and VX2 from the voltage VSS (for example, 0 V), respectively. The sequencer 25 electrically connects between the booster circuit 263 and all the wirings GWL via the UCG driver 27_25. Therefore, all the wirings GWL are charged by the voltage VX2.

At time T40, the sequencer 25 electrically connects the booster circuit 263 to the selected wiring GWL connected to the selected block BLK via any one of the CG drivers 27_0 to 27_23. Therefore, the voltage VX2 is subsequently transmitted to the selected wiring GWL connected to the selected block BLK. In addition, the sequencer 25 electrically connects the booster circuit 262 to the non-selected wirings GWL connected to the selected block BLK via the CG drivers 27_0 to 27_23 and CGU driver 27_24. Therefore, the non-selected wirings GWL connected to the selected block BLK are further charged by the voltage VREAD from the voltage VX2. In contrast, the sequencer 25 electrically disconnects the booster circuit 263 from other wirings GWL, and causes the voltages of other wirings GWL to be discharged to the voltage VSS.

At time T41, the sequencer 25 electrically disconnects the booster circuit 263 from the selected wiring GWL connected to the selected block BLK, and causes the voltage of the selected wiring GWL connected to the selected block BLK to be discharged to the voltage VSS.

At time T42, the sequencer 25 electrically connects the booster circuit 261 to the selected wiring GWL connected to the selected block BLK via any one of the CG drivers 27_0 to 27_23. Therefore, the selected wiring GWL connected to the selected block BLK is charged by the voltage VCGRV. In addition, the sequencer 25 electrically connects other wirings GWL to the external power via the UCG driver 27_25. Therefore, other wirings GWL are charged by the voltage VCC.

Further, at the point of time T42, the non-selected wirings GWL connected to the selected block BLK are completely charged by the voltage VREAD. Therefore, subsequent to time T42, the data is rapidly read from the selected block BLK.

2.3 Advantage According to Second Embodiment

According to the second embodiment, the sequencer 25 electrically connects the booster circuit 263 to all the wirings GWL via the UCG driver 27_25 before the block address is confirmed. Therefore, all the wirings GWL are charged up to the voltage VX2 until time T40. Therefore, subsequent to time T40 at which the block address is confirmed, the non-selected wirings GWL connected to the selected block BLK may be charged by a difference between the voltage VX2 and the voltage VREAD, and thus it is possible to reduce time which is required for charging. Therefore, it is possible to reduce time required for the read operation. In addition, the voltages of all the wirings GWL are not charged up to the voltage VREAD which is a high voltage, and thus it is possible to reduce the loads applied to the wiring group CGI.

2.4 First Modified Example

Further, in the second embodiment, a case where the voltage VX2 is applied to the selected wiring GWL connected to the selected block BLK over a period of time T40 to time T41 has been described. However, embodiments are not limited thereto. For example, the voltage VREAD may be applied to the selected wiring GWL connected to the selected block BLK.

Figure 18:
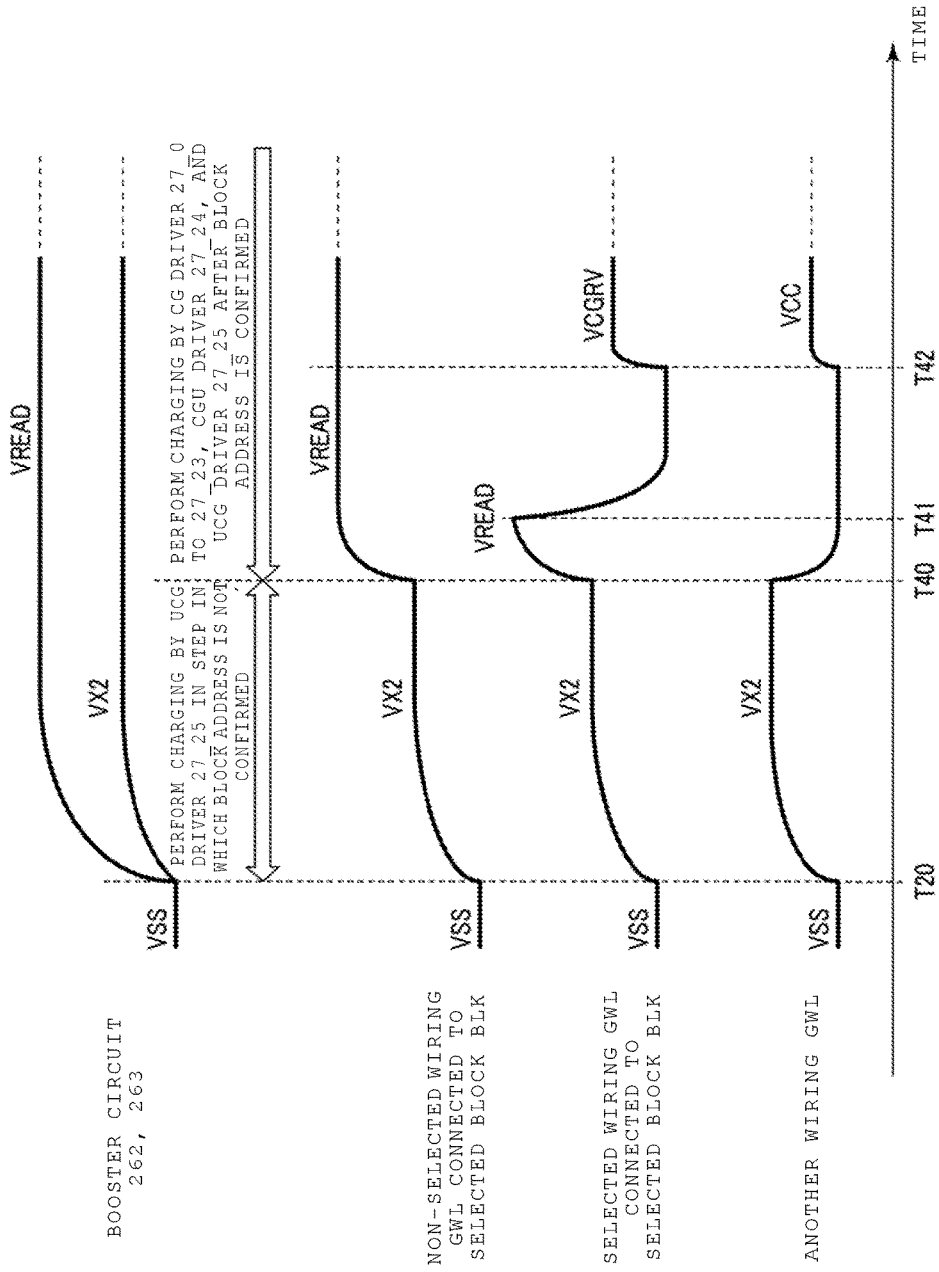
FIG. 18 is a timing chart illustrating a read operation performed in a semiconductor storage device according to a first modified example of the second embodiment.

FIG. 18 is a timing chart illustrating a read operation of a semiconductor storage device according to a first modified example of the second embodiment. FIG. 18 corresponds to FIG. 17 described in the second embodiment, and is the same as FIG. 17 other than operations from time T40 to time T41.

As illustrated in FIG. 18, at time T40, the sequencer 25 electrically connects the booster circuit 262 to the selected wiring GWL connected to the selected block BLK via any one of the CG drivers 27_0 to 27_23. Therefore, the selected wiring GWL connected to the selected block BLK is further charged by the voltage VREAD from the voltage VX2.

In a case where the operation is performed as described above, it is possible to apply the voltage VREAD which is higher than the voltage VX2 before the voltage VCRV is applied to the selected word line WL. Therefore, it is possible to perform a more stable read operation.

2.5 Second Modified Example

Further, in the second embodiment, a case where the voltage VX2 is applied to all the wirings GWL before the block address is confirmed has been described. However, embodiments are not limited thereto. For example, the voltage VCC may be applied to all the wirings GWL from the external power before the block address is confirmed.

Figure 19:
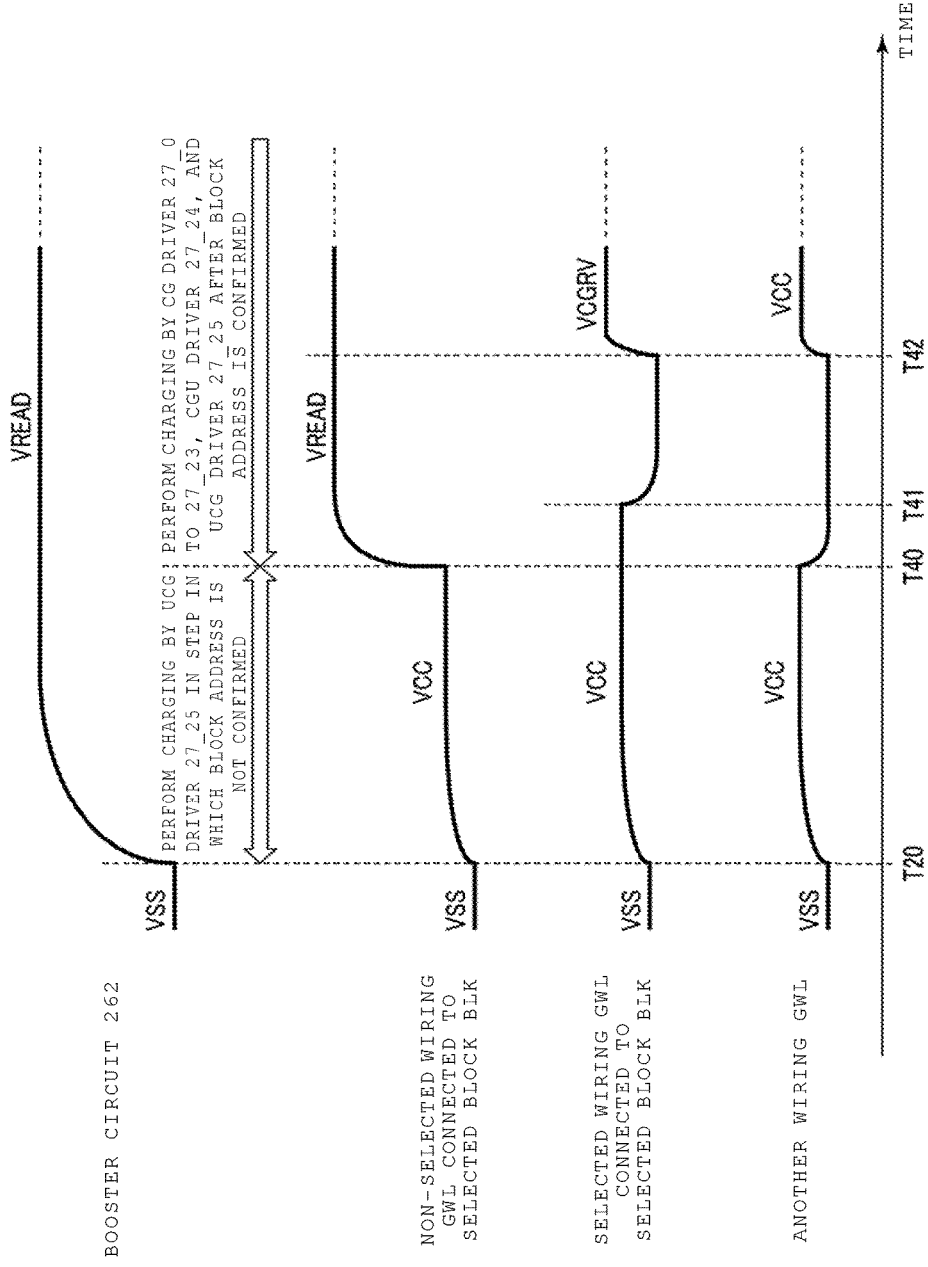
FIG. 19 is a timing chart illustrating a read operation performed in a semiconductor storage device according to a second modified example of the second embodiment.

FIG. 19 is a timing chart illustrating a read operation of a semiconductor storage device according to a second modified example of the second embodiment. FIG. 19 corresponds to FIG. 17 described in the second embodiment.

As illustrated in FIG. 19, at time T20, the booster circuit 262 starts boosting to the voltage VREAD from the voltage VSS (for example, 0 V).

The sequencer 25 electrically connects between the external power and all the wirings GWL via the UCG driver 27_25. Therefore, all the wirings GWL are charged by the voltage VCC.

At time T40, the sequencer 25 electrically connects the external power to the selected wiring GWL connected to the selected block BLK via any one of the CG drivers 27_0 to 27_23. Therefore, the voltage VCC is subsequently transmitted to the selected wiring GWL connected to the selected block BLK. In addition, the sequencer 25 electrically connects the booster circuit 262 to the non-selected wirings GWL connected to the selected block BLK via the CG drivers 27_0 to 27_23 and CGU driver 27_24. Therefore, the non-selected wirings GWL connected to the selected block BLK are further charged by the voltage VREAD from the voltage VCC. In contrast, the sequencer 25 electrically disconnects the external power from other wirings GWL, and causes the voltages of other wirings GWL to be discharged to the voltage VSS.

At time T41, the sequencer 25 electrically disconnects the external power to the selected wiring GWL connected to the selected block BLK, and causes the voltage of the selected wiring GWL connected to the selected block BLK to be discharged to the voltage VSS.

At time T42, the sequencer 25 electrically connects the booster circuit 261 to the selected wiring GWL connected to the selected block BLK via any one of the CG drivers 27_0 to 27_23. Therefore, the selected wiring GWL connected to the selected block BLK is charged by the voltage VCGRV. In addition, the sequencer 25 electrically connects other wirings GWL to the external power via the UCG driver 27_25. Therefore, other wirings GWL are charged by the voltage VCC.

Further, at the point of time T42, the non-selected wirings GWL connected to the selected block BLK are completely charged by the voltage VREAD. Therefore, subsequent to time T42, the data is rapidly read from the selected block BLK.

In a case where the operation is performed as described above and, for example, where leakage occurs in the wiring GWL, it is possible to prevent the voltage to be supplied to the wiring GWL from fluctuating. In addition, in a case where the voltage VX2 is transmitted to the wiring GWL in a state in which the leakage occurs in the wiring GWL, there is a possibility that the voltage of the wiring GWL significantly fluctuates from the voltage VX2 by being affected by the leakage. In addition, the voltage VX2 is used for many other purposes in the semiconductor storage device 20. Therefore, a case where a value of the voltage VX2 significantly fluctuates is not preferable in a point of view in which a device in the semiconductor storage device 20 is normally operated. In contrast, in the modified example, since the voltage VCC is supplied from the external power, the voltage VCC changes very little even though being affected by leakage occurred in the wiring GWL. Therefore, it is possible to prevent leakage from affecting another device in the semiconductor storage device 20 and it is possible to securely charge the wiring GWL. Therefore, it is possible to reduce time which is required for charging.

3. The Others

Embodiments are not limited to the above-described respective embodiments and forms described in the respective modified examples, and various changes are possible. In the above-described respective embodiments and the respective modified examples, the cases where one type of voltage VREAD is transmitted to the word lines WL (non-selected word lines WL) corresponding to the non-selected wirings GWL connected to the selected block BLK are described. However, embodiments are not limited thereto. For example, different voltages may be supplied to the non-selected word lines WL according to whether the non-selected word line is on an upper layer or a lower layer of the selected word line WL. In this case, the word line selection circuit 28_3 may be a charging route passing via a further switch circuit. However, even in the above-described case, the charging route, which passes via the UCG driver 27_25, may pass via a smaller number of switch circuits than the charging route which passes via the CG drivers 27_0 to 27_23 or the CGU driver 27_24. Therefore, it is possible to acquire the same advantage as in the above-described respective embodiments and the respective modified examples.

In addition, in the above-described respective embodiments and the respective modified examples, the case where all the wirings GWL are charged via the UCG driver 27_25 before the block address is confirmed is described. However, embodiments are not limited thereto. For example, all the wirings GWL may be charged via the CG drivers 27_0 to 27_23 and the CGU driver 27_24 before the block address is confirmed. In this case, as described above, although the number of switch circuits to be passed is larger than the charging route via the UCG driver 27_25, the power transmission transistor VTr4 is not required. Therefore, it is possible to form the driver set 27 with a smaller number of elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a word line and a wiring;
a first transistor that is controlled to connect the word line to the wiring;
a first booster circuit configured to boost an output voltage thereof to a first voltage;
a second transistor that is controlled to connect an output of the first booster circuit to the wiring; and
a control circuit configured to control the first booster circuit, and the first and second transistors during a read operation, wherein during the read operation,
the control circuit controls the first booster circuit to start boosting the output voltage thereof to the first voltage while controlling the second transistor to connect the output of the first booster circuit to the wiring so that a voltage of the wiring rises together with the output voltage of the first booster circuit, and
after the output voltage of the first booster circuit has reached the first voltage, the control circuit controls the first transistor to connect the word line to the wiring.

2. The semiconductor storage device according to claim 1, wherein
after the output voltage of the first booster circuit has reached the first voltage and the control circuit controls the first transistor to connect the word line to the wiring, the control circuit causes the voltage of the wiring to be a ground voltage and then controls the voltage of the wiring to be a second voltage that is lower than the first voltage.

3. The semiconductor storage device according to claim 1, further comprising:
a second booster circuit configured to boost an output voltage thereof to a second voltage; and
a third transistor that is controlled to connect an output of the second booster circuit to the wiring, wherein
the control circuit controls the second transistor to disconnect the output of the first booster circuit from the wiring and controls the third transistor to connect the output of the second booster circuit to the wiring, to cause the voltage of the wiring to be at the second voltage.

4. The semiconductor storage device according to claim 3, wherein the word line is a selected word line for the read operation.

5. The semiconductor storage device according to claim 1, wherein
the word line is a non-selected word line for the read operation, and
after the output voltage of the first booster circuit has reached the first voltage and the control circuit controls the first transistor to connect the word line to the wiring, the control circuit maintains the voltage of the wiring to be at the first voltage while a voltage of a selected word line is at a second voltage that is less than the first voltage.

6. The semiconductor storage device according to claim 1, wherein the first transistor is connected to a block selection signal line.

7. The semiconductor storage device according to claim 1, further comprising:
a second booster circuit configured to boost an output voltage thereof to a second voltage that is higher than the first voltage; and
a third transistor that is controlled to connect an output of the second booster circuit to the wiring, wherein
after the output voltage of the first booster circuit has reached the first voltage and the control circuit controls the first transistor to connect the word line to the wiring, the control circuit controls the second transistor to disconnect the output of the first booster circuit from the wiring and controls the third transistor to connect the output of the second booster circuit to the wiring, to cause the voltage of the wiring to be at the second voltage.

8. The semiconductor storage device according to claim 7, wherein the word line is a non-selected word line for the read operation.

9. The semiconductor storage device according to claim 8, further comprising:
a fourth transistor that is controlled to connect another wiring to a selected word line for the read operation;
a third booster circuit configured to boost an output voltage thereof to a third voltage that is lower than the first voltage; and
a fifth transistor that is controlled to connect an output of the third booster circuit to said another wiring, wherein
during the read operation, after said another wiring has reached the first voltage, the control circuit controls the fourth transistor to connect the selected word line to said another wiring, causes the voltage of said another wiring to be a ground voltage, and then controls the fifth transistor to connect the output of the third booster circuit to said another wiring, to cause the voltage of said another wiring to be at the third voltage.

10. The semiconductor storage device according to claim 1, wherein
a gradient of voltage increase of the first booster circuit to the first voltage is substantially the same as a gradient of voltage increase of the wiring.

11. A semiconductor storage device comprising:
first and second word lines;
a voltage generation circuit;

a plurality of wirings;
a drive circuit configured to selectively apply voltages generated by the voltage generation circuit to the wirings;
a first transistor that is controlled to connect one of the wirings to the first word line;
a second transistor that is controlled to connect another one of the wirings to the second word line; and
a control circuit configured to control the voltage generation circuit, the drive circuit and the first and second transistors, wherein during a read operation,
the control circuit controls the voltage generation circuit to generate a first voltage at an output thereof, the drive circuit to apply the first voltage from the voltage generation circuit to the plurality of wirings, and after the wirings have reached the first voltage, control the first and second transistors to connect the respective wirings to the first and second word lines.

12. The semiconductor storage device according to claim 11, wherein
a gradient of voltage increase to the first voltage of the output of the voltage generation circuit is substantially the same as a gradient of voltage increase of the wirings.

13. The semiconductor storage device according to claim 11, wherein the first and second transistors are turned on by a block selection signal and the voltage level of the wirings has increased to the first voltage when the block selection signal is applied to gates of the first and second transistors.

14. The semiconductor storage device according to claim 13, wherein the first word line is a selected word line for the read operation and the second word line is a non-selected word line for the read operation.

15. The semiconductor storage device according to claim 14, wherein
after the block selection signal is applied to gates of the first and second transistors, the control circuit causes the voltage level of the first word line to be at a ground voltage, and then to increase to a second voltage that is less than the first voltage.

16. The semiconductor storage device according to claim 15, wherein
after the block selection signal is applied to gates of the first and second transistors, the control circuit causes the voltage level of the second word line to be maintained at the first voltage during the read operation.

17. The semiconductor storage device according to claim 15, wherein
after the block selection signal is applied to gates of the first and second transistors, the control circuit causes the voltage level of the second word line to increase to a third voltage that is higher than the first voltage and maintained at the third voltage during the read operation.

18. The semiconductor storage device according to claim 11, wherein the drive circuit includes a plurality of first transistors that are controlled to connect a first output of the voltage generation circuit to the wirings and a plurality of second transistors that are controlled to connect a second output of the voltage generation circuit to the wirings.

19. The semiconductor storage device according to claim 18, further comprising:
a plurality of additional word lines, wherein
the first word lines, the second word line, and the additional word lines are connected to a block of memory cells, and a total number of the first word lines, the second word line, and the additional word lines is greater than a total number of the wirings connected to the drive circuit.

20. The semiconductor storage device according to claim 19, wherein the total number of the first word lines, the second word line, and the additional word lines is an integer multiple of the total number of the wirings connected to the drive circuit.

* * * * *